United States Patent
Bang et al.

(10) Patent No.: US 10,403,695 B2
(45) Date of Patent: Sep. 3, 2019

(54) ORGANIC LIGHT-EMITTING DISPLAY DEVICE AND METHOD OF MANUFACTURING THE SAME

(71) Applicant: LG Display Co., Ltd., Seoul (KR)

(72) Inventors: Hyungseok Bang, Goyang-si (KR);
JongGeun Yoon, Gunpo-si (KR);
KyungHoon Lee, Goyang-si (KR);
DongHee Yoo, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/790,490

(22) Filed: Oct. 23, 2017

(65) Prior Publication Data

US 2018/0122875 A1    May 3, 2018

(30) Foreign Application Priority Data

Oct. 31, 2016 (KR) .................. 10-2016-0143924

(51) Int. Cl.
*H01L 27/32* (2006.01)
*H01L 51/52* (2006.01)

(52) U.S. Cl.
CPC ........ *H01L 27/3246* (2013.01); *H01L 27/323* (2013.01); *H01L 27/3248* (2013.01); *H01L 27/3262* (2013.01); *H01L 51/5203* (2013.01); *H01L 51/5212* (2013.01)

(58) Field of Classification Search
CPC .................................................. H01L 27/3246
See application file for complete search history.

(56) References Cited

U.S. PATENT DOCUMENTS

2007/0201056 A1* 8/2007 Cok ................. B82Y 20/00
                                                                358/1.9
2017/0069696 A1* 3/2017 Kondo ............... H01L 27/3276

* cited by examiner

*Primary Examiner* — Moazzam Hossain
*Assistant Examiner* — Hajar Kolahdouzan
(74) *Attorney, Agent, or Firm* — Morgan, Lewis & Bockius LLP

(57) ABSTRACT

An organic light-emitting display device and a method of manufacturing the same are provided. An organic light-emitting display device includes: first electrodes, a first pixel-defining layer configured to divide the first electrodes, a second pixel-defining layer on the first pixel-defining layer, an organic light-emitting layer on a first electrode among the first electrodes, and a second electrode on the organic light-emitting layer, wherein a width of the second pixel-defining layer is wider than a width of the first pixel-defining layer.

15 Claims, 19 Drawing Sheets

ORGANIC LIGHT-EMITTING DISPLAY DEVICE AND METHOD OF MANUFACTURING THE SAME

CROSS-REFERENCE TO RELATED APPLICATIONS

This application claims the priority of Korean Application No. 10-2016-0143924, filed on Oct. 31, 2016, the entirety of which is hereby incorporated by reference.

BACKGROUND

1. Technical Field

The present disclosure relates to an organic light-emitting display device and a method of manufacturing the same.

2. Discussion of the Related Art

With the advancement of an information-oriented society, various requirements for display devices for displaying an image are increasing. Therefore, various display devices, such as liquid crystal display (LCD) devices, plasma display panel (PDP) devices, organic light-emitting display devices, etc., are recently being used.

As a type of display device, organic light-emitting display devices are self-emitting display devices, and have better viewing angle and contrast ratio than LCD devices. Also, because the organic light-emitting display devices do not need a separate backlight, it is possible to lighten and thin the organic light-emitting display devices. Also, the organic light-emitting display devices are excellent in power consumption. Furthermore, the organic light-emitting display devices are driven with a low direct current (DC) voltage, have a fast response time, and are low in manufacturing cost.

The organic light-emitting display devices each include anode electrodes, a bank that divides the anode electrodes; a hole transporting layer, an organic light-emitting layer, and an electron transporting layer that are formed on the anode electrodes; and a cathode electrode formed on the electron transporting layer. In this case, when a high-level voltage is applied to the anode electrode and a low-level voltage is applied to the cathode electrode, a hole and an electron respectively move to the organic light-emitting layer through the hole transporting layer and the electron transporting layer, and are combined with each other in the organic light-emitting layer to emit light.

In the organic light-emitting display devices, an area where an anode electrode, an organic light-emitting layer, and a cathode electrode are sequentially stacked is an emissive area that emits light, and an area where a bank is provided is a non-emissive area that does not emit light. That is, the emissive area may be defined as a pixel, and in this case, the bank acts as a pixel-defining layer that defines the pixel.

Recently, head-mounted displays, each including an organic light-emitting display device, are being developed. Head-mounted displays are glasses-type monitor devices that are worn in a glasses type or a helmet type, and form a focal point at a distance close to eyes of a user, and may realize virtual reality (VR) or augmented reality (AR). Small organic light-emitting display devices having a high resolution are applied to the head-mounted displays. However, in the small organic light-emitting display devices having a high resolution, because a degree of integration of pixels is high, a size of each of the pixels is reduced, and for this reason, a luminance of light emitted from each pixel is lowered.

SUMMARY

Accordingly, the present disclosure is directed to an organic light-emitting display device and a method of manufacturing the same that substantially obviate one or more of the issues due to limitations and disadvantages of the related art.

In one aspect, embodiments of the present disclosure may provide an organic light-emitting display device and a method of manufacturing the same, in which a size of each pixel is maximized.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts as embodied and broadly described, there is provided an organic light-emitting display device, including: first electrodes, a first pixel-defining layer configured to divide the first electrodes, a second pixel-defining layer on the first pixel-defining layer, an organic light-emitting layer on a first electrode among the first electrodes, and a second electrode on the organic light-emitting layer, wherein a width of the second pixel-defining layer is wider than a width of the first pixel-defining layer.

In another aspect, there is provided an organic light-emitting display device, including: first electrodes, an organic light-emitting layer on each of the first electrodes, a second electrode on the organic light-emitting layer, a plurality of color filters each in correspondence with the first electrodes, respectively, and a low refractive index medium layer between adjacent color filters, the low refractive index medium layer having a refractive index lower than respective refractive indexes of each of the plurality of color filters.

In another aspect, there is provided a method of manufacturing an organic light-emitting display device, the method including: providing a thin film transistor (TFT), providing a planarization layer on the TFT, providing a pixel-defining layer, including providing, on the planarization layer, a first pixel-defining layer and a second pixel-defining layer, a width of the second pixel-defining layer being wider than a width of the first pixel-defining layer, providing a first electrode on the planarization layer, providing an organic light-emitting layer on the first electrode, and providing a second electrode on the organic light-emitting layer.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments of the disclosure. It is to be understood that both the foregoing general description and the following detailed description of the present disclosure are examples and explanatory, and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain various principles of the disclosure.

Figure 1:
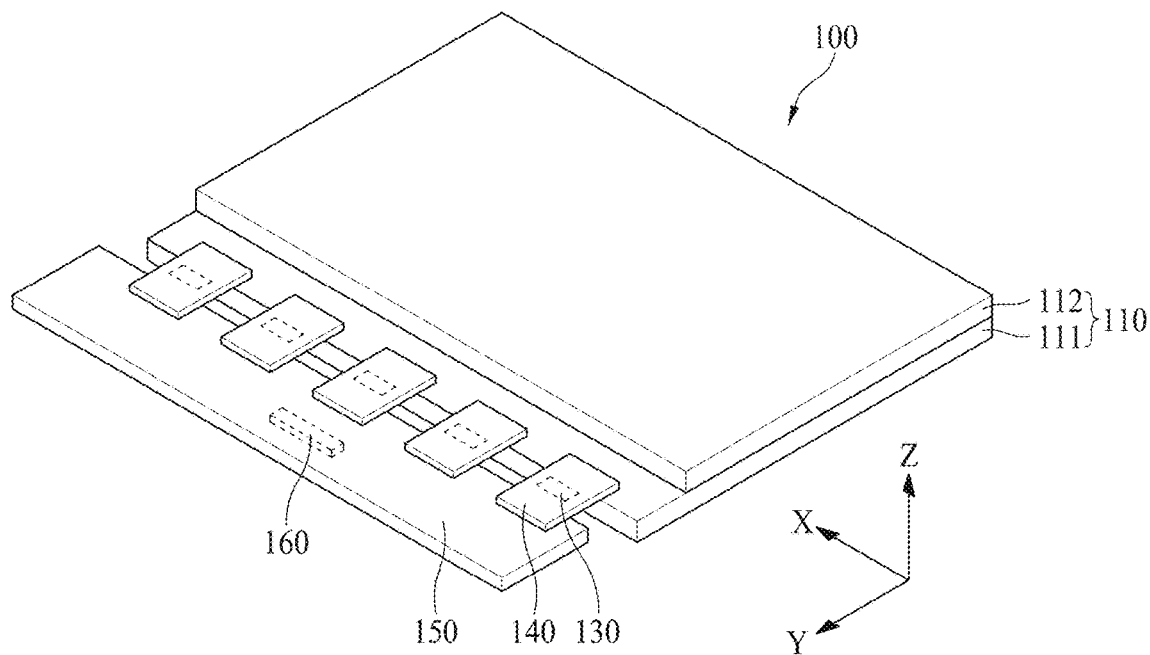
FIG. 1 is a perspective view illustrating an organic light-emitting display device according to an embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to some embodiments of the present disclosure, examples of which are illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

In the description of embodiments, when a structure is described as being positioned "on or above" or "under or below" another structure, this description should be construed as including a case in which the structures contact each other as well as a case in which a third structure is disposed therebetween.

An x-axis direction, a y-axis direction, and a z-axis direction should not be construed as only a geometric relationship where a relationship therebetween is vertical, and may denote having a broader directionality within a scope where elements of the present disclosure operate functionally.

Figure 2:
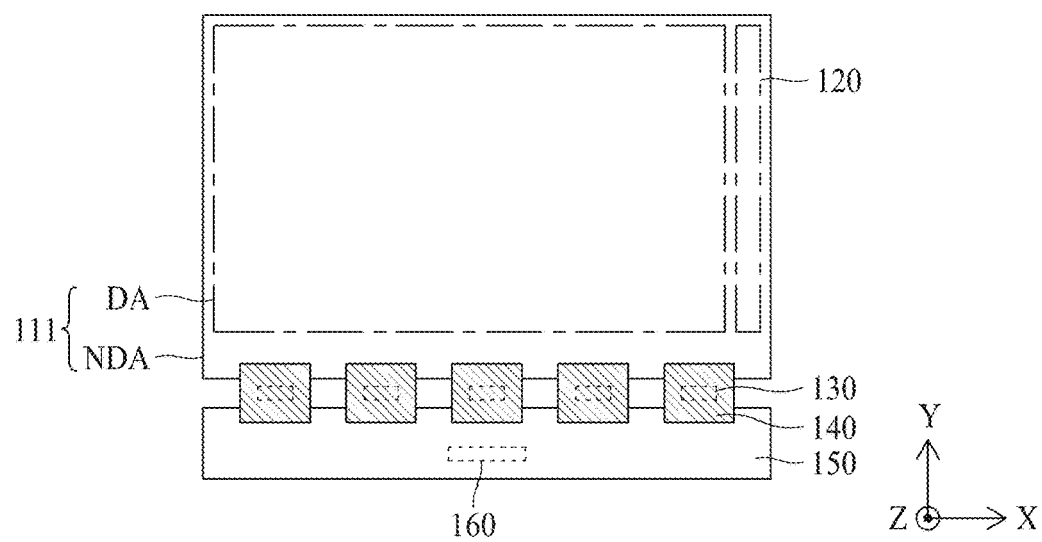
FIG. 2 is a plan view illustrating a first substrate, a gate driver, a source drive integrated circuit (IC), a flexible film, a circuit board, and a timing controller of FIG. 1.

FIG. 1 is a perspective view illustrating an organic light-emitting display device according to an embodiment of the present disclosure. FIG. 2 is a plan view illustrating a first substrate, a gate driver, a source drive integrated circuit (IC), a flexible film, a circuit board, and a timing controller of FIG. 1.

With reference to FIGS. 1 and 2, the organic light-emitting display device 100 according to an embodiment of the present disclosure may include a display panel 110, a gate driver 120, a source drive IC 130, a flexible film 140, a circuit board 150, and a timing controller 160. The display panel 110 may include a first substrate 111 and a second substrate 112. The second substrate 112 may be an encapsulation substrate. The first substrate 111 may be a plastic film, a glass substrate, or the like. The second substrate 112 may be a plastic film, a glass substrate, an encapsulation film, or the like. In an embodiment of the present disclosure, the second substrate 112 may be omitted.

A plurality of gate lines, a plurality of data lines, and a plurality of pixels may be provided on one surface of the first substrate 111 facing the second substrate 112. The pixels may be respectively provided in a plurality of areas defined by an intersection structure of the gate lines and the date lines.

Each of the pixels may include a thin film transistor (TFT) and an organic light-emitting device, which may include a first electrode, an organic light-emitting layer, and a second electrode. When a gate signal is input through a gate line, each of the pixels may supply a particular current to the organic light-emitting device using the TFT according to a data voltage supplied through a data line. Therefore, the organic light-emitting device of each of the pixels may emit light having particular brightness according to the particular current. A structure of each of the pixels will be described in detail with reference to FIGS. 4 and 9.

The display panel 110, as illustrated in FIG. 2, may be divided into a display area DA, where the pixels are provided to display an image, and a non-display area NDA that does not display an image. The gate lines, the data lines, and the pixels may be provided in the display area DA. The gate driver 120 and a plurality of pads may be provided in the non-display area NDA.

The gate driver 120 may sequentially supply gate signals to the gate lines according to a gate control signal input from the timing controller 160. The gate driver 120 may be provided in the non-display area NDA outside one side or both sides of the display area DA of the display panel 110 in a gate driver-in-panel (GIP) type. Alternatively, the gate driver 120 may be manufactured as a driving chip, and may be mounted on a flexible film. Moreover, the gate driver 120 may be attached on the non-display area NDA outside the one side or the both sides of the display area DA of the display panel 110 in a tape automated bonding (TAB) type.

The source drive IC 130 may receive digital video data and a source control signal from the timing controller 160. The source driver IC 130 may convert the digital video data into analog data voltages according to the source control signal, and may respectively supply the analog data voltages to the data lines. If the source drive IC 130 is manufactured as a driving chip, the source drive IC 130 may be mounted on the flexible film 140 in a chip-on-film (COF) type or a chip-on-plastic (COP) type. Embodiments are not limited to these examples.

A plurality of pads, such as data pads, may be provided in the non-display area NDA of the display panel 110. Lines connecting the pads to the source drive IC 130 and lines connecting the pads to lines of the circuit board 150 may be provided on the flexible film 140. The flexible film 140 may be attached on the pads using an anisotropic conductive film. Thus, the pads may be connected to the lines of the flexible film 140.

The circuit board 150 may be attached on the flexible film 140, which may be provided in plurality. A plurality of circuits implemented as driving chips may be mounted on the circuit board 150. For example, the timing controller 160 may be mounted on the circuit board 150. The circuit board 150 may be a printed circuit board (PCB) or a flexible printed circuit board (FPCB).

The timing controller 160 may receive the digital video data and a timing signal from an external system board (not shown) through a cable of the circuit board 150. The timing controller 160 may generate a gate control signal for controlling an operation timing of the gate driver 120, and a source control signal for controlling the source drive IC 130 that may be provided in plurality, based on the timing signal. The timing controller 160 may supply the gate control signal to the gate driver 120, and may supply the source control signal to the plurality of source drive ICs 130.

Figure 3:
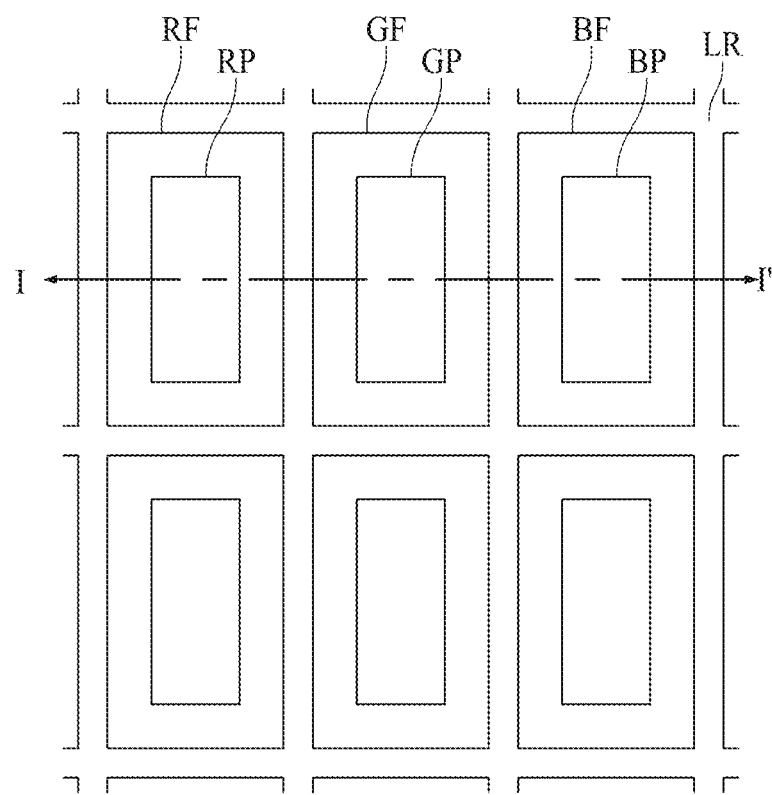
FIG. 3 is a plan view illustrating in detail an example of pixels in a display area.

FIG. 3 is a plan view illustrating in detail an example of pixels in a display area.

In FIG. 3, for convenience of description, only a red pixel RP, a green pixel GP, and a blue pixel BP; a red color filter RF, a green color filter GF, and a blue color filter BF; and a low refractive index medium layer LR are illustrated. With reference to FIG. 3, each of the red pixel RP, the green pixel GP, and the blue pixel BP may denote an area where a first electrode corresponding to an anode electrode, an organic light-emitting layer, and a second electrode corresponding to a cathode electrode may be sequentially stacked, and a hole from the first electrode and an electron from the second electrode may be combined with each other to emit light in the organic light-emitting layer. The red pixel RP, the green pixel GP, and the blue pixel BP may be defined by a pixel-defining layer.

In an embodiment of the present disclosure, the organic light-emitting layer may be provided as a common layer in the red pixel RP, the green pixel GP, and the blue pixel BP to emit light. Therefore, the red pixel RP, the green pixel GP, and the blue pixel BP may be provided so that the red pixel RP emits red light, the green pixel GP emits green light, and the blue pixel BP emits blue light. In one example, the red color filter RF may be disposed in correspondence with the red pixel RP, the green color filter GF may be disposed in correspondence with the green pixel GP, and the blue color filter BF may be disposed in correspondence with the blue pixel BP.

As in the FIG. 3 example, when the red pixel RP, the green pixel GP, and the blue pixel BP are provided, the red pixel RP, the green pixel GP, and the blue pixel BP may be defined as one unit pixel. However, the embodiments are not limited thereto. For example, a white subpixel may be additionally provided. In one example, a red subpixel, a green subpixel, a blue subpixel, and a white subpixel may be defined as one unit pixel.

The low refractive index medium layer LR may divide the red color filter RF, the green color filter GF, and the blue color filter BF. As such, the low refractive index medium layer LR may be disposed between the red color filter RF, the green color filter GF, and the blue color filter BF. Also, the low refractive index medium layer LR may be provided in a non-emissive area. Thus, the low refractive index medium layer LR may be disposed to overlap the pixel-defining layer.

A refractive index of the low refractive index medium layer LR may be lower than that of each of the red color filter RF, the green color filter GF, and the blue color filter BF. For example, the red color filter RF, the green color filter GF, and the blue color filter BF may each include an organic material, and, in one example, may have a refractive index of 1.5 or more. The low refractive index medium layer LR may have a refractive index that is lower than 1.5. For example, the low refractive index medium layer LR may be an air layer, and in one example, may have a refractive index of 1.0.

A refractive index of the low refractive index medium layer LR may be lower than that of each of the red color filter RF, the green color filter GF, and the blue color filter BF. Therefore, light that travels from each of the red color filter RF, green color filter GF, and blue color filter BF to the low refractive index medium layer LR may be totally reflected from the low refractive index medium layer LR, and may be output to the outside through each of the red color filter RF, the green color filter GF, and the blue color filter BF. Accordingly, in an embodiment of the present disclosure, a luminance of light emitted from each of the red pixel RP, the green pixel GP, and the blue pixel BP may be enhanced.

Figure 4:
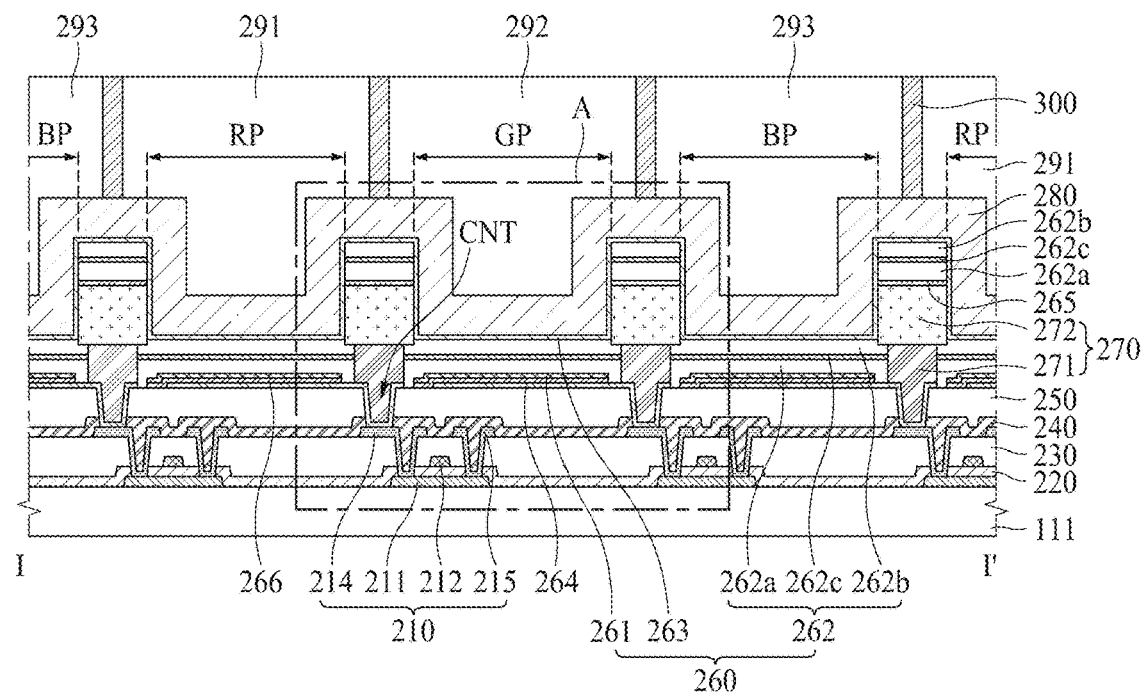
FIG. 4 is a cross-sectional view illustrating in detail an example taken along line I-I' of FIG. 3.
Figure 5:
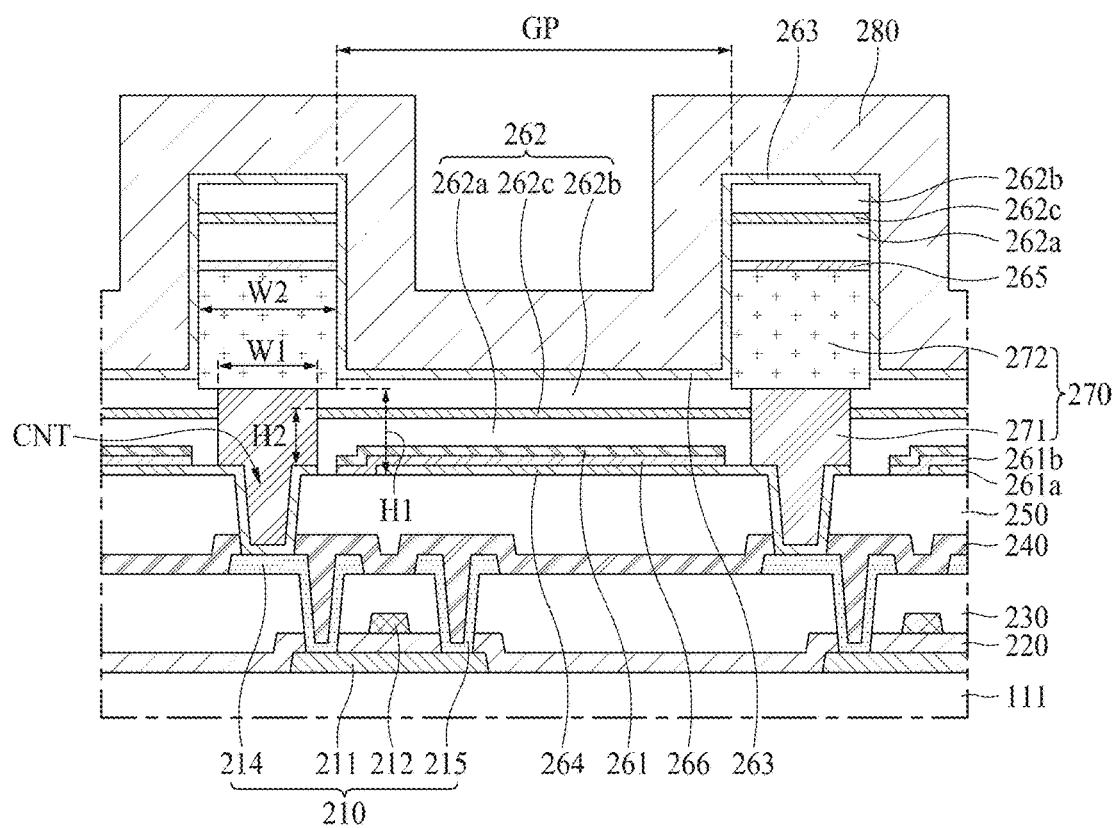
FIG. 5 is an enlarged view of area A of FIG. 4.

FIG. 4 is a cross-sectional view illustrating in detail an example taken along line I-I' of FIG. 3. FIG. 5 is an enlarged view of area A of FIG. 4.

With reference to FIGS. 4 and 5, a buffer layer may be formed on one surface of the first substrate 111 facing the second substrate 112. The buffer layer may be formed on the one surface of the first substrate 111, for protecting a plurality of TFTs 210 and a plurality of organic light-emitting devices 260 from water that may penetrate through the first substrate 111 that may be vulnerable to penetration of water. The buffer layer may include a plurality of inorganic layers that may be alternately stacked. For example, the buffer layer may have a multilayer structure in which one or more inorganic layers, e.g., of silicon oxide ($SiO_x$), silicon nitride ($SiN_x$), and SiON may be alternately stacked. The buffer layer may be omitted.

The TFTs 210 may be formed on the buffer layer. Each of the TFTs 210 may include an active layer 211, a gate electrode 212, a source electrode 215, and a drain electrode 214. In the FIG. 4 example, the TFTs 210 are illustrated as being provided in a top-gate type in which the gate electrode 212 is disposed on the active layer 211, but embodiments are not limited thereto. In other embodiments, the TFTs 210 may be provided in a bottom-gate type in which the gate electrode 212 is disposed under the active layer 211, or a double-gate type in which the gate electrode 212 is disposed both on and under the active layer 211.

The active layer 211 may be formed on the buffer layer. The active layer 211 may include, for example, a silicon-based semiconductor material or an oxide-based semiconductor material. A light blocking layer for blocking external light incident on the active layer 211 may be provided between the buffer layer and the active layer 211.

A gate insulation layer 220 may be formed on the active layer 211. The gate insulation layer 220 may be formed of an inorganic layer, for example, silicon oxide ($SiO_x$), silicon nitride ($SiN_x$), or a multilayer thereof.

The gate electrode 212 and a gate line may be formed on the gate insulation layer 220. The gate electrode 212 and the gate line may each be formed of a single layer or a multilayer, and may include, e.g., one or more of molybdenum (Mo), chromium (Cr), titanium (Ti), nickel (Ni), neodymium (Nd), and copper (Cu), or an alloy thereof.

An interlayer dielectric 230 may be formed on the gate electrode 212 and the gate line. The interlayer dielectric 230 may be formed of an inorganic layer, for example, $SiO_x$, $SiN_x$, or a multilayer thereof.

The source electrode 215, the drain electrode 214, and a data line may be formed on the interlayer dielectric 230. The source electrode 215 may contact the active layer 211 through a contact hole that may pass through the gate insulation layer 220 and the interlayer dielectric 230. The drain electrode 214 may contact the active layer 211 through a contact hole that may pass through the gate insulation layer 220 and the interlayer dielectric 230. The source electrode 215, the drain electrode 214, and the data line may each be formed of a single layer or a multilayer, which may include, e.g., one or more of Mo, Cr, Ti, Ni, Nd, and Cu, or an alloy thereof.

A passivation layer 240 for insulating the TFTs 210 may be formed on the source electrode 215, the drain electrode 214, and the data line. The passivation layer 240 may be formed of an inorganic layer, for example, $SiO_x$, $SiN_x$, or a multilayer thereof.

A planarization layer 250, for planarizing a step height caused by the TFTs 210, may be formed on the passivation layer 240. The passivation layer 250 may include an organic layer, such as acryl resin, epoxy resin, phenolic resin, polyamide resin, polyimide resin, or the like.

An auxiliary electrode 264, an organic light-emitting device 260, and a pixel-defining layer 270 may be formed on the planarization layer 250. The organic light-emitting device 260 may include a first electrode 261, an organic light-emitting layer 262, and a second electrode 263. The first electrode 261 may be an anode electrode, and the second electrode 263 may be a cathode electrode.

The auxiliary electrode 264 may be formed on the planarization layer 250. The auxiliary electrode 264 may be connected to the source electrode 215 or the drain electrode 214 of the TFT 210 through a contact hole CNT, which may pass through the passivation layer 240 and the planarization layer 250 to expose the drain electrode 214 of the TFT 210. A first pixel-defining layer 271 may be formed on the auxiliary electrode 264 in the contact hole CNT. If a step height of the contact hole CNT is exposed without being covered by the first pixel-defining layer 271, the organic light-emitting layer 262 may be non-uniformly formed in the contact hole CNT. Thus, the auxiliary electrode 264 may be short-circuited with the second electrode 263 or a charge generating layer 262c of the organic light-emitting layer 262, whereby the contact hole CNT may be filled by the first pixel-defining layer 271. The auxiliary electrode 264 may include a transparent metal material or an opaque metal material. The transparent metal material may include, e.g., a transparent conductive material (TCO), such as indium tin oxide (ITO) or indium zinc oxide (IZO), or a semi-transmissive conductive material such as magnesium (Mg), silver (Ag), or an alloy of Mg and Ag. The opaque metal material may be, e.g., aluminum (Al), molybdenum (Mo), a stacked structure (Mo/Ti) of Mo and titanium (Ti), copper (Cu), or a stacked structure (Ti/Al/Ti) of Al and Ti.

The reflective electrode 266 and the first electrode 261 may be formed on the auxiliary electrode 264 without being covered by the first pixel-defining layer 271. That is, the reflective electrodes 266 and the first electrodes 261 may be may be divided by the first pixel-defining layer 271. The reflective electrode 266 may include a metal material, which may be high in reflectivity, such as Al, Ag, or an APC alloy. The first electrode 261 may include, e.g., a transparent metal material (TCO), such as ITO or IZO, which may transmit light. Due to the reflective electrode 266, light of the organic light-emitting layer 262 traveling in a direction toward the first electrode 261 may be reflected in a direction toward the second electrode 263. That is, in an embodiment of the present disclosure, the display device may be implemented as a top-emission type. Thus, the reflective electrode 266 may be disposed under the first electrode 261. However, embodiments are not limited thereto.

The pixel-defining layer 270 may be formed in the contact hole CNT, e.g., for dividing the pixels RP, GP, and BP. That is, the pixel-defining layer 270 may define the pixels RP, GP, and BP. Also, an area in which the pixel-defining layer 270 is provided may not emit light. Thus, the pixel-defining layer 270 may be defined as a non-emissive area.

The pixel-defining layer 270 may include the first pixel-defining layer 271 and a second pixel-defining layer 272. The first pixel-defining layer 271 may be disposed in the contact hole CNT, and the second pixel-defining layer 272 may be disposed on the first pixel-defining layer 271.

A width W2 of the second pixel-defining layer 272 may be set wider than a width W1 of the first pixel-defining layer 271. That is, the pixel-defining layer 270 may have a mushroom structure in which an upper portion may be wider than a lower portion.

Moreover, the first pixel-defining layer 271 and the second pixel-defining layer 272 may be formed of different materials. For example, the first pixel-defining layer 271 may be formed of $SiO_x$, and the second pixel-defining layer 272 may be formed of $SiN_x$.

Moreover, the second pixel-defining layer 272 may have a vertical structure, as in the FIG. 5 example. The vertical structure may denote a structure in which an angle between a bottom and a side of the second pixel-defining layer 272 is 90° (degrees). However, a structure of the second pixel-defining layer 272 is not limited to the vertical structure, and the second pixel-defining layer 272 may be formed in a taper structure as in the examples of FIGS. 10 and 11. The taper structure may denote a structure in which the angle between the bottom and the side of the second pixel-defining layer 272 is 0° (degrees) to 90° (degrees).

Moreover, the second pixel-defining layer 272 may include a light absorbing material that absorbs light. Alternatively, a light-absorbing layer 265 that absorbs light may be provided on the second pixel-defining layer 272. The light-absorbing layer 265 may be formed, e.g., of a stacked structure (Mo/Ti) of Mo and Ti. In one example, light of the organic light-emitting layer traveling in a horizontal direction may be absorbed by the second pixel-defining layer 272 or the light-absorbing layer 265. Accordingly, in an embodiment of the present disclosure, light emitted from the organic light-emitting layer of one pixel may be prevented from traveling (or less light may travel) to an adjacent pixel, thereby reducing or preventing color mixture.

In the related art, because the pixel-defining layer 270 covers an edge of the first electrode 261, a size of each of the pixels RP, GP, and BP is reduced due to the pixel-defining layer 270. However, in an embodiment of the present disclosure, because the pixel-defining layer 270 may not cover an edge of the first electrode 261, there may be no area damaged by the pixel-defining layer 270 in each of the pixels RP, GP, and BP. Accordingly, in an embodiment of the present disclosure, a size of each of the pixels RP, GP, and BP may be maximized.

The organic light-emitting layer 262 may be formed on the first electrode 261 and the second pixel-defining layer 272. The organic light-emitting layer 262 may be a common layer that may be formed in the pixels RP, GP, and BP in common, and may be a white light-emitting layer that may emit white light. In one example, as in FIG. 5, the organic light-emitting layer 262 may be formed in a tandem structure of two or more stacks. Each of stacks 262a and 262b may include a hole transporting layer, at least one light-emitting layer, and an electron transporting layer.

Moreover, a charge generating layer 262c may be formed between the stacks 262a and 262b. The charge generating layer 262c may include an n-type charge generating layer, disposed adjacent to a lower stack, and a p-type charge generating layer that may be formed on the n-type charge generating layer, and may be disposed adjacent to an upper stack. The n-type charge generating layer may inject an electron into the lower stack, and the p-type charge generating layer may inject a hole into the upper stack. The n-type charge generating layer may be formed of an organic layer that may be doped, e.g., with an alkali metal, such as lithium (Li), sodium (Na), potassium (K), or cesium (Cs); or with an alkali earth metal, such as magnesium (Mg), strontium (Sr), barium (Ba), or radium (Ra). The p-type charge generating layer may be an organic layer that may be formed by doping a dopant on an organic host material having an ability to transport holes.

However, embodiments of the present disclosure are not limited to a case in which the organic light-emitting layer 262 is formed as a common layer that is formed in common in the red pixel RP, the green pixel GP, and the blue pixel BP. That is, the organic light-emitting layer 262 according to an embodiment of the present disclosure may include a red organic light-emitting layer that may be disposed in correspondence with the red pixel RP to emit red light, a green organic light-emitting layer that may be disposed in correspondence with the green pixel GP to emit green light, and a blue organic light-emitting layer that may be disposed in correspondence with the blue pixel BP to emit blue light. In this case, color filters 291, 292, and 293 may be omitted.

The organic light-emitting layer 262 may be formed in a deposition process or a solution process. In an example of being formed in the deposition process, the organic light-emitting layer 262 may be formed in an evaporation process.

A layer formed in the evaporation process may have a poor step coverage characteristic. The step coverage denotes that a layer deposited by a deposition process is continuously connected (or continuous) without being disconnected (or discontinuous), even in a portion in which a step height is formed. Therefore, a thickness of the organic light-emitting layer 262 formed on each of side surfaces of the second pixel-defining layer 272 may be thinner than that of the organic light-emitting layer 262 formed on the first electrode 261 and that of the organic light-emitting layer 262 formed on a top of the second pixel-defining layer 272.

If a height H2 of the charge generating layer 262c of the organic light-emitting layer 262 is set lower than a height H1 of the first pixel-defining layer 271, the charge generating layer 262c formed on the first electrode 261 may be disconnected from the charge generating layer 262c formed on each of the side surfaces of the second pixel-defining layer 272. If the organic light-emitting layer 262 is formed in the pixels RP, GP, and BP in common, a current of one pixel can be leaked to an adjacent pixel through the charge generating layer 262c of the organic light-emitting layer 262. However, according to an embodiment of the present disclosure, because the height H2 of the charge generating layer 262c of the organic light-emitting layer 262 is set lower than the height H1 of the first pixel-defining layer 271, the charge generating layer 262c of the organic light-emitting layer 262 may be disconnectedly (or discontinuously) provided in the second pixel-defining layer 272. Accordingly, in an embodiment of the present disclosure, an adjacent pixel may be less affected or prevented from being affected by a leakage current leaked through the charge generating layer 262c of the organic light-emitting layer 262. Also, in an area other than the first electrode 261, the organic light-emitting layer 262 may be prevented from emitting light (or may emit less light) due to a leakage of a current.

The second electrode 263 may be formed on the organic light-emitting layer 262. The second electrode 263 may be a common layer that may be formed in the pixels RP, GP, and BP in common. The second electrode 263 may be formed on the organic light-emitting layer 262. The second electrode 263 may be a common layer that may be formed in the pixels P in common. The second electrode 263 may include, e.g., a transparent conductive material (or TCO), such as indium tin oxide (ITO) or indium zinc oxide (IZO) capable of transmitting light; or a semi-transmissive conductive material, such as Mg, Ag, or an alloy of Mg and Ag. A reflective electrode 266 may be disposed under the first electrode 261. Thus, in an example in which the second electrode 263 is formed of the semi-transmissive conductive material, a micro-cavity effect may be obtained. A capping layer may be formed on the second electrode 263.

The second electrode 263 may be formed through a physical vapor deposition (PVD) process, such as a sputtering process. A layer formed in the PVD process, such as the sputtering process, may have a good step coverage characteristic. Therefore, even if the second pixel-defining layer 272 is formed in a vertical structure or a taper structure, the second electrode 263 may be continuously connected without being disconnected (or discontinuous) in the second pixel-defining layer 272.

An encapsulation layer 280 may be formed on the second electrode 263. The encapsulation layer 280 may reduce or prevent oxygen or water from penetrating into the organic light-emitting layer 262 and the second electrode 263. To this end, the encapsulation layer 280 may include at least one inorganic layer and at least one organic layer.

The color filters 291, 292, and 293 may be formed on the encapsulation layer 280. A red color filter 291 may be disposed in correspondence with the red pixel RP, a green color filter 292 may be disposed in correspondence with the green pixel GP, and a blue color filter 293 may be disposed in correspondence with the blue pixel BP.

A low refractive index medium layer 300 may divide the red, green, and blue color filters 291, 292, and 293. The low refractive index medium layer 300 may divide the red, green, and blue color filters 291, 292, and 293. Also, because the low refractive index medium layer 300 may be disposed between the red, green, and blue color filters 291, 292, and 293, the low refractive index medium layer 300 may be disposed to overlap the pixel-defining layer 270 disposed between the color filters RP, GP, and BP.

A refractive index of the low refractive index medium layer 300 may be lower than that of each of the red, green, and blue color filters 291, 292, and 293. For example, the red, green, and blue color filters 291, 292, and 293 may each be formed of an organic material, and in one example, may have a refractive index of 1.5 or more. The low refractive index medium layer 300 may have a refractive index that is lower than 1.5. For example, the low refractive index medium layer 300 may be an air layer, and in one example, may have a refractive index of 1.0.

A refractive index of the low refractive index medium layer 300 may be lower than that of each of the red, green, and blue color filters 291, 292, and 293. Therefore, if an incident angle is greater than a threshold angle, light that travels from each of the red, green, and blue color filters 291, 292, and 293 to the low refractive index medium layer 300 may be totally reflected. Consequently, the light that travels from each of the red, green, and blue color filters 291, 292, and 293 to the low refractive index medium layer 300 may be totally reflected from the low refractive index medium layer 300, and may be output to the outside through each of the red, green, and blue color filters 291, 292, and 293. Accordingly, in an embodiment of the present disclosure, a luminance of light emitted from each of the red pixel RP, the green pixel GP, and the blue pixel BP may be enhanced. Also, in an embodiment of the present disclosure, lights respectively emitted from the red pixel RP, the green pixel GP, and the blue pixel BP may be isolated from each other in each pixel. Thus, if an upper surface of each of the red, green, and blue color filters 291, 292, and 293 is formed in a concave-convex shape, an emission efficiency of each of the red pixel RP, the green pixel GP, and the blue pixel BP may be more enhanced.

Figure 6:
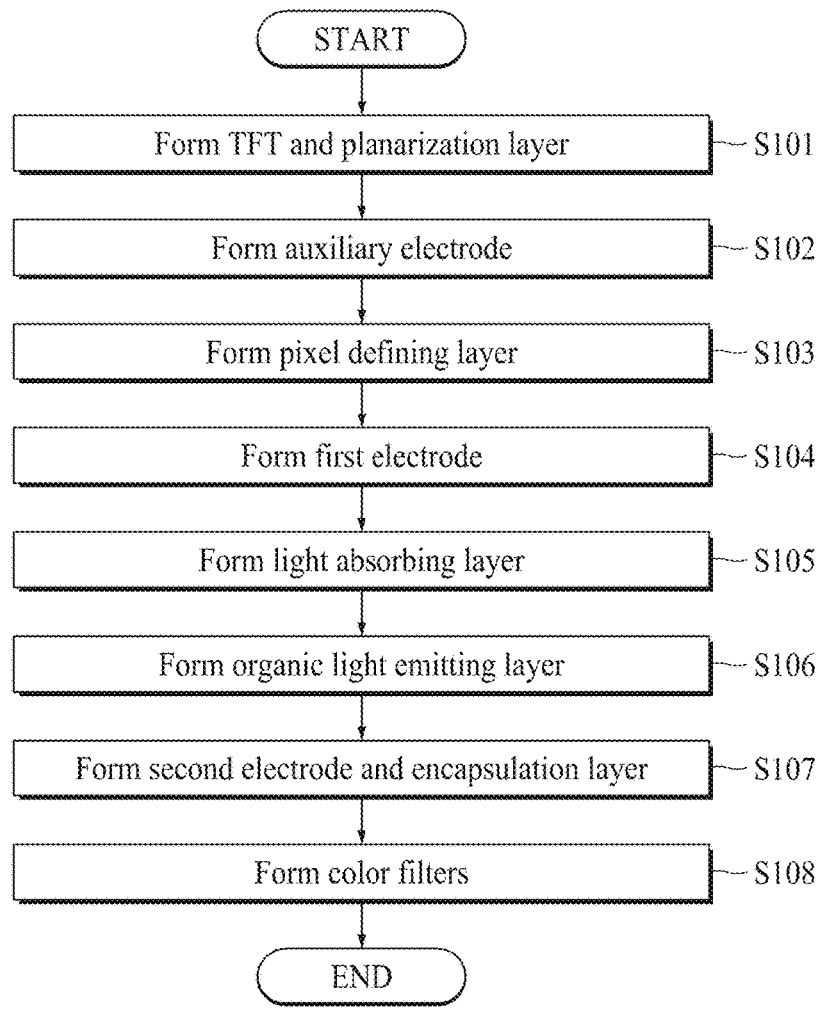
FIG. 6 is a flowchart illustrating a method of manufacturing an organic light-emitting display device according to an embodiment of the present disclosure.

FIG. 6 is a flowchart illustrating a method of manufacturing an organic light-emitting display device according to an embodiment of the present disclosure. FIGS. 7A to 7I are cross-sectional views illustrating a method of manufacturing an organic light-emitting display device according to an embodiment of the present disclosure, based on the flowchart of FIG. 6.

Figure 7A:
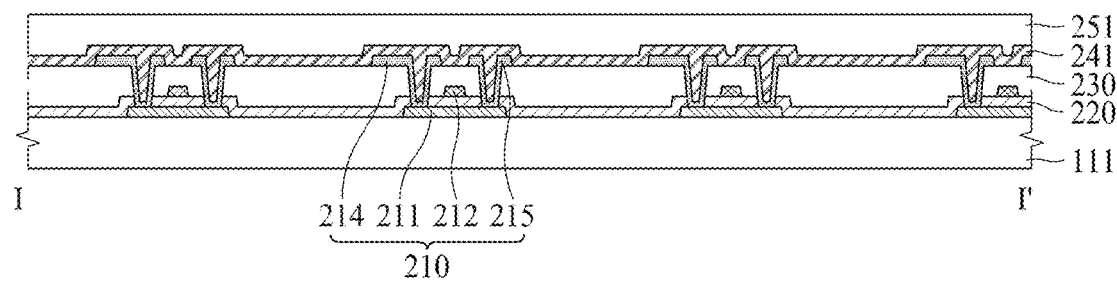
FIGS. 7A to 7I are cross-sectional views illustrating a method of manufacturing an organic light-emitting display device according to an embodiment of the present disclosure, based on the flowchart of FIG. 6.
Figure 7B:
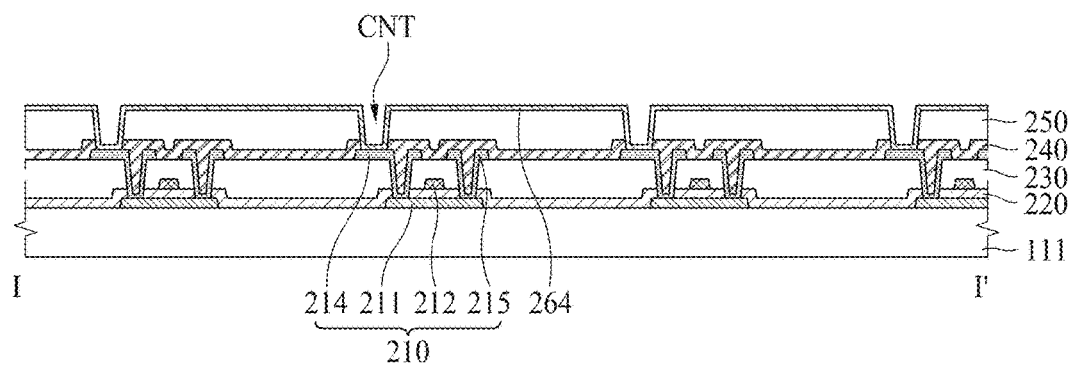

In operation S101 of FIG. 6 and in the FIG. 7A example, a TFT 210 and a planarization layer 250 may be formed. Before the TFT 210 is formed, a buffer layer may be formed on a first substrate 111 for protecting the TFT 210 from water penetrating through a substrate 100. The buffer layer may include a plurality of inorganic layers that may be alternately stacked for protecting the TFT 210 and an organic light-emitting device 260 from water that may penetrates through the first substrate 111 that may be vulnerable to penetration of water. For example, the buffer layer may be formed of a multilayer in which one or more inorganic layers of silicon oxide ($SiO_x$), silicon nitride ($SiN_x$), and SiON may be alternately stacked. The buffer layer may be formed, for example, using a chemical vapor deposition (CVD) process.

Subsequently, an active layer 211 of the TFT 210 may be formed on the buffer layer. An active metal layer may be formed all over the buffer layer, for example, using a sputtering process, a metal organic chemical vapor (MOCVD) process, or the like. Subsequently, the active layer 211 may be formed, for example, by patterning the active metal layer through a mask process using a photoresist pattern. The active layer 211 may be formed of a silicon-based semiconductor material, an oxide-based semiconductor material, or the like.

Subsequently, a gate insulation layer 220 may be formed on the active layer 211. The gate insulation layer 220 may be formed of an inorganic layer, for example, silicon oxide ($SiO_x$), silicon nitride ($SiN_x$), or a multilayer thereof.

Subsequently, a gate electrode 212 of the TFT 210 may be formed on the gate insulation layer 220. A first metal layer may be formed all over the gate insulation layer 220, for example, by using a sputtering process, an MOCVD process, or the like. Subsequently, the gate electrode 212 may be formed by patterning the first metal layer, for example, through a mask process using a photoresist pattern. The gate electrode 212 may be formed of a single layer or a multilayer, which may include, e.g., one or more of molybdenum (Mo), chromium (Cr), titanium (Ti), nickel (Ni), neodymium (Nd), and copper (Cu), or an alloy thereof.

Subsequently, an interlayer dielectric 230 may be formed on the gate electrode 212. The interlayer dielectric 230 may be formed of an inorganic layer, for example, $SiO_x$, $SiN_x$, or a multilayer thereof. Subsequently, a plurality of contact holes that may pass through the gate insulation layer 220 and the interlayer dielectric 230 to expose the active layer 211 may be formed.

Subsequently, a source electrode 215 and a drain electrode 214 of the TFT 210 may be formed on the interlayer dielectric 230. A second metal layer may be formed all over the interlayer dielectric 230, for example, using a sputtering process, an MOCVD process, or the like. Subsequently, the source electrode 215 and the drain electrode 214 may be formed, for example, by patterning the second metal layer through a mask process using a photoresist pattern. Each of the source electrode 215 and the drain electrode 214 may contact the active layer 211 through a contact hole that may pass through the gate insulation layer 220 and the interlayer dielectric 230. The source electrode 215 and the drain electrode 214 may each be formed of a single layer or a multilayer, which may include, e.g., one or more of Mo, Cr, Ti, Ni, Nd, and Cu, or an alloy thereof.

Subsequently, a passivation layer 240 may be formed on the source electrode 215 and the drain electrode 214 of the TFT 210. The passivation layer 240 may be formed of an inorganic layer, for example, $SiO_x$, $SiN_x$, or a multilayer thereof. The passivation layer 240 may be formed using a CVD process.

Subsequently, a planarization layer 250 for planarizing a step height caused by the TFT 210 may be formed on the passivation layer 240. The passivation layer 250 may be formed of an organic layer, such as acryl resin, epoxy resin, phenolic resin, polyamide resin, polyimide resin, or the like.

Figure 7C:
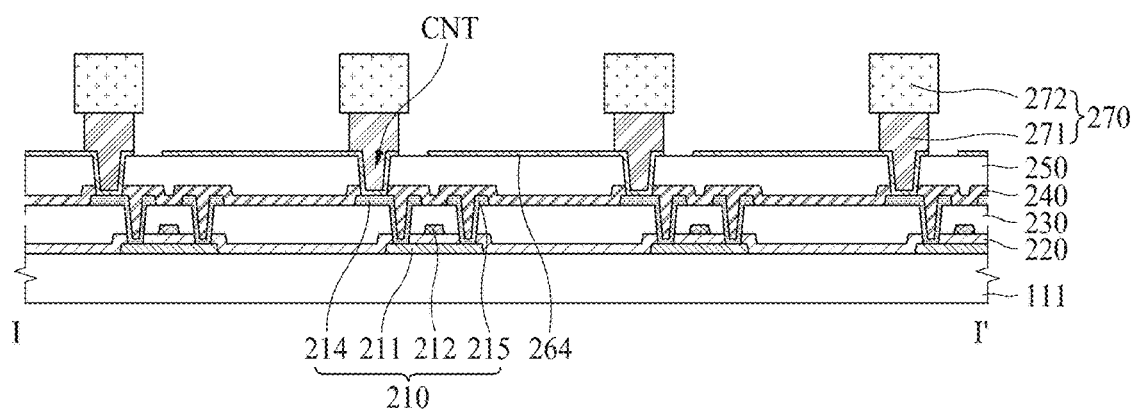
Figure 7D:
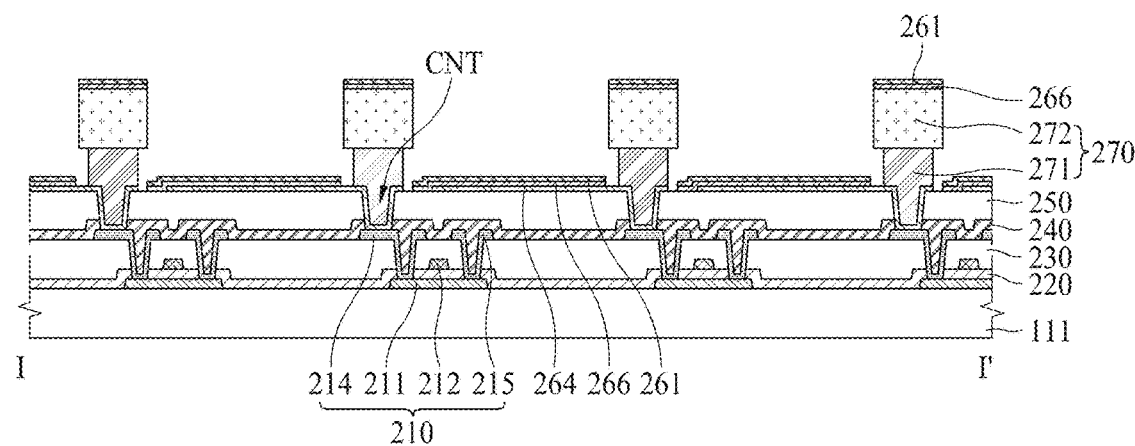
Figure 7E:
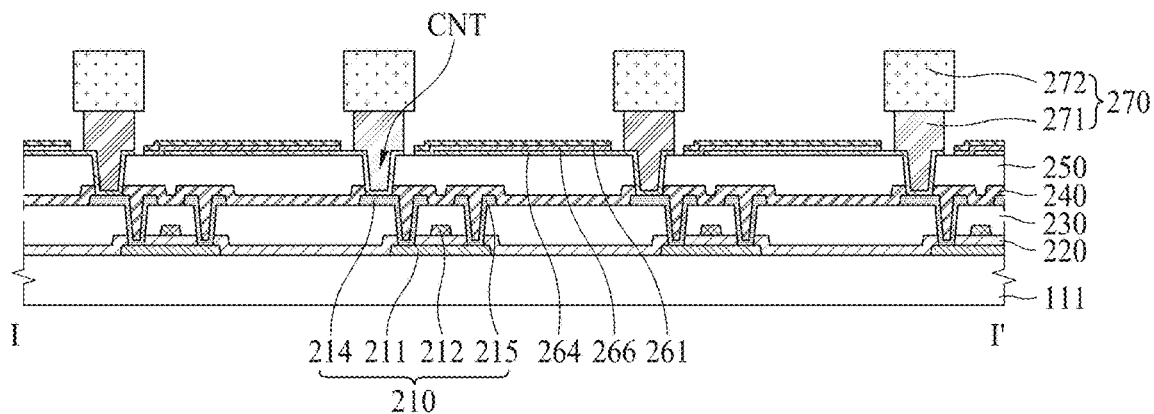

In operation S102 of FIG. 6 and in the FIG. 7D example, an auxiliary electrode layer 264' may be formed on the planarization layer 250. A contact hole CNT, which may pass through the passivation layer 240 and the planarization layer 250 to expose the source electrode 215 or the drain electrode 214 of the TFT 210, may be formed.

Subsequently, the auxiliary electrode layer 264' may be formed on the planarization layer 250. The auxiliary electrode layer 264' may be connected to the source electrode 215 or the drain electrode 214 of the TFT 210. The auxiliary electrode layer 264' may include, for example, a transparent metal material or an opaque metal material. The transparent metal material may be, e.g., a transparent conductive material (TCO), such as indium tin oxide (ITO) or indium zinc oxide (IZO); or a semi-transmissive conductive material, such as magnesium (Mg), silver (Ag), or an alloy of Mg and Ag. The opaque metal material may be, e.g., aluminum (Al), molybdenum (Mo), a stacked structure (Mo/Ti) of Mo and titanium (Ti), copper (Cu), or a stacked structure (Ti/Al/Ti) of Al and Ti.

In operation S103 of FIG. 6 and in the FIG. 7C example, a pixel-defining layer 270 may be formed in the contact hole CNT. A method of forming the pixel-defining layer 270 will be described in detail with reference to FIGS. 8A to 8D.

Figure 8A:
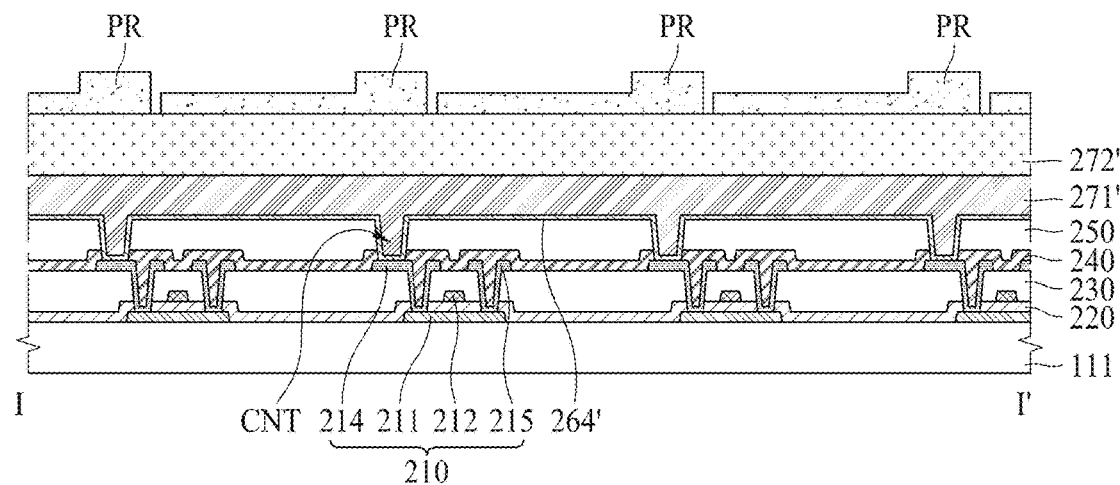
FIGS. 8A to 8E are cross-sectional views illustrating in detail an operation of FIG. 6.

In the example of FIG. 8A, a first inorganic layer 271' and a second inorganic layer 272' may be formed on the auxiliary electrode layer 264'. The first inorganic layer 271' may be formed, e.g., of $SiO_x$, and the second inorganic layer 272' may be formed, e.g., of $SiN_x$. Also, a photoresist pattern PR for a halftone process may be formed on the second inorganic layer 272'. A thickness of the photoresist pattern PR, in an area in which a second pixel-defining layer 272 is to be formed, may be formed thicker than that of the photoresist pattern PR in the other area.

Figure 8B:
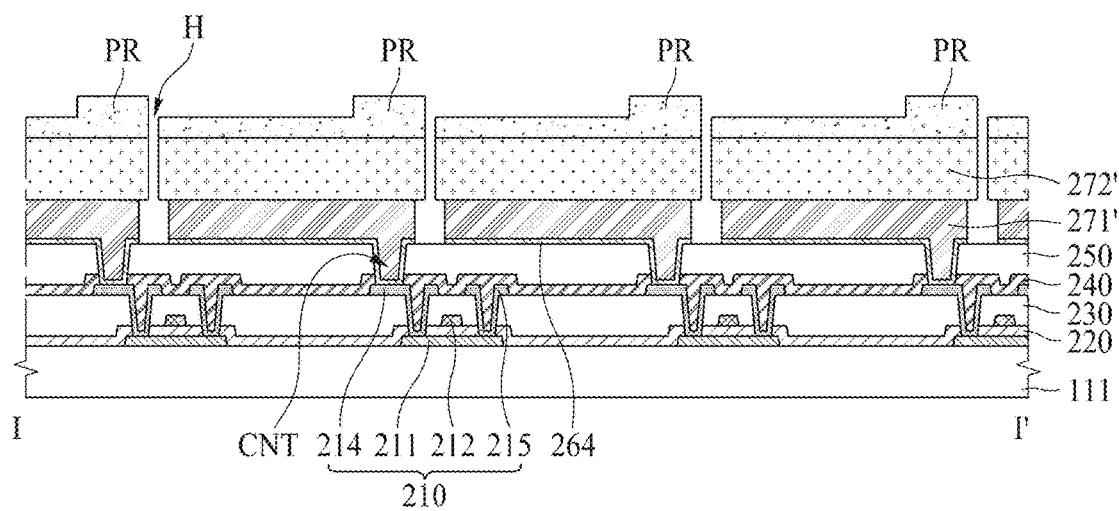

Subsequently, as in the FIG. 8B example, a hole H may be formed. The hole H may pass through the auxiliary electrode layer 264', the first inorganic layer 271', and the second inorganic layer 272' uncovered by the photoresist pattern PR. Thus, the auxiliary electrode 264 may be patterned.

Figure 8C:
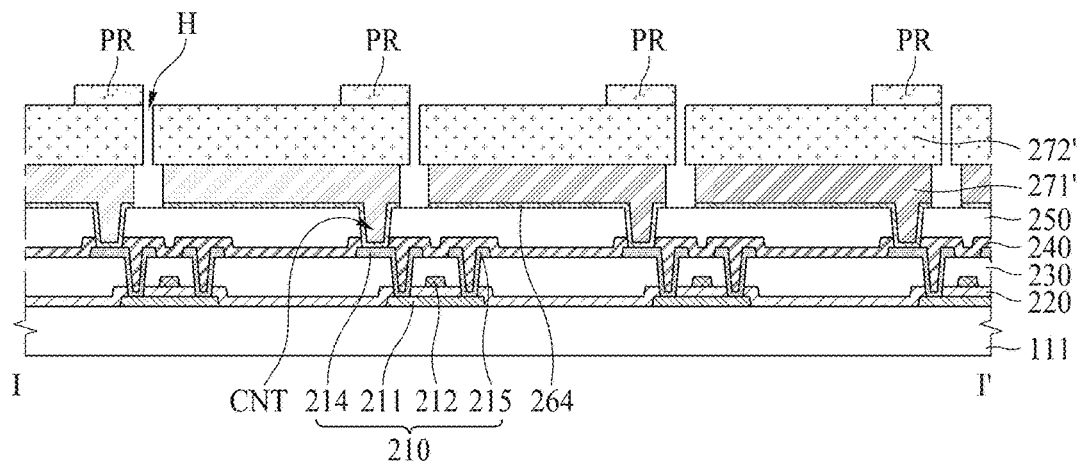

Subsequently, as in the FIG. 8C example, by etching the photoresist pattern PR, the photoresist pattern PR in the other area, except the photoresist pattern PR in an area in which the second pixel-defining layer 272 is to be formed, may be removed.

Figure 8D:
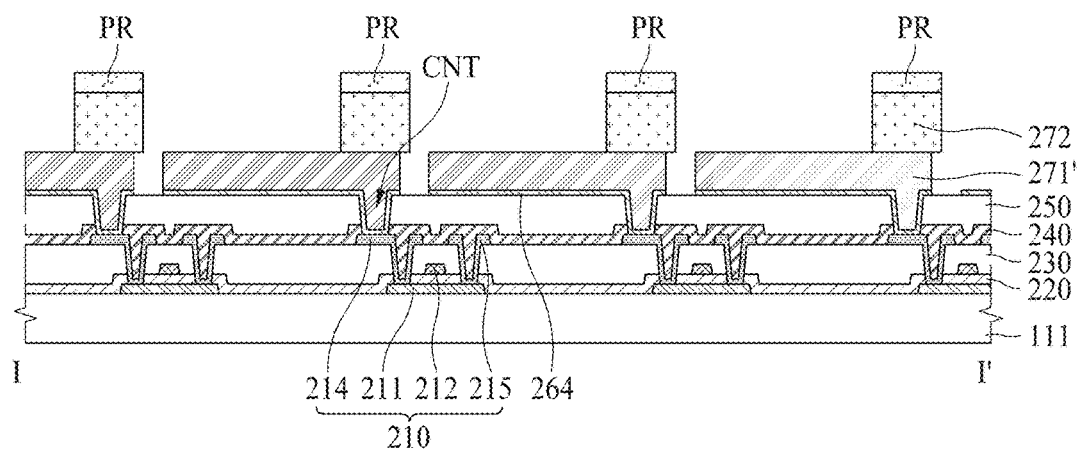

Subsequently, as in the example of FIG. 8D, the second pixel-defining layer 272 may be formed, e.g., through a dry etching process. A gas applied to the dry etching process may be a gas that etches only the second inorganic layer 272' without etching the auxiliary electrode 264 and the first inorganic layer 271'.

A high frequency inductive coupled plasma apparatus may distribute the gas into a chamber through a gas supply means, may apply a first radio frequency (RF) power to a power supply unit disposed over a substrate, and may apply a second RF power to a power supply unit disposed under the substrate, thereby performing an anisotropic etching process on the second inorganic layer 272' using a physical impact between ions. That is, the high frequency inductive coupled plasma apparatus may individually control ion energy applied to the second inorganic layer 272'. Accordingly, in an embodiment of the present disclosure, by performing the anisotropic etching process with the high frequency inductive coupled plasma apparatus, the second pixel-defining layer 272 may be formed in a vertical structure or a taper structure.

Figure 8E:
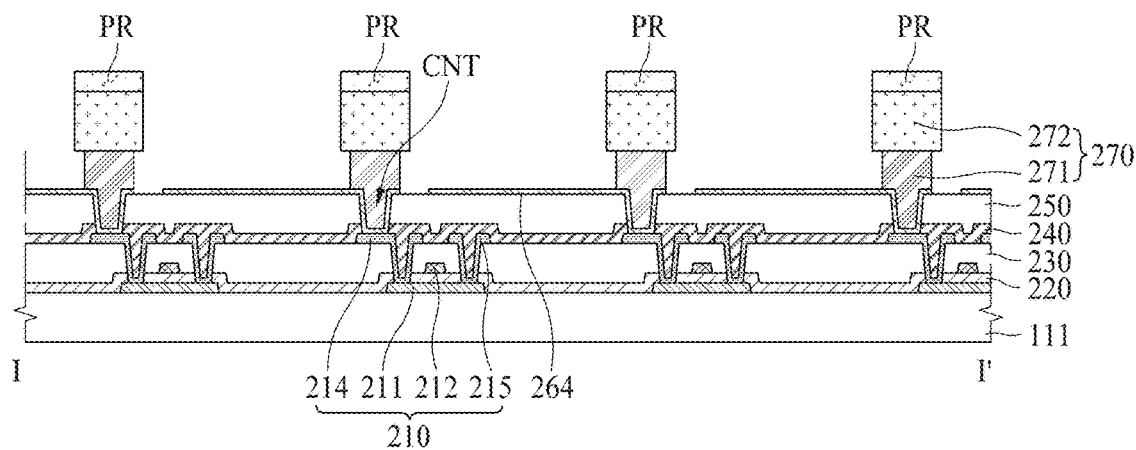

Subsequently, as in the FIG. 8E example, a first pixel-defining layer 271 may be formed by etching the first inorganic layer 271' with the second pixel-defining layer 272 as a mask. A process of etching the first inorganic layer 271' may use both a dry etching process and a wet etching process. A gas applied to the dry etching process for the first inorganic layer 271' may be a gas that etches only the first inorganic layer 271' without etching the auxiliary electrode 264 and the second pixel-defining layer 272. Also, an etchant applied to the wet etching process for the first inorganic layer 271' may be a solution that etches only the first inorganic layer 271' without etching the auxiliary electrode 264 and the second pixel-defining layer 272. In an example of etching the first inorganic layer 271' through the wet etching process, a width W2 of the second pixel-defining layer 272 may be easily formed to be wider than a width W1 of the first pixel-defining layer 271. The photoresist pattern PR, which may remain on the second pixel-defining layer 272 after the first pixel-defining layer 271 is formed, may be removed.

In operation S104 of FIG. 6 and in the FIG. 7D example, a reflective electrode 266 and a first electrode 261 may be formed on the auxiliary electrode 264 and the second pixel-defining layer 272. Using an MOCVD process or a sputtering process, the reflective electrode 266 and the first electrode 261 may be formed on the auxiliary electrode 264 and the second pixel-defining layer 272 without a mask process using a photoresist pattern. Because the reflective electrode 266 and the first electrode 261 may be formed through a physical vapor deposition (PVD) process, such as a sputtering process, the reflective electrode 266 and the first electrode 261 may have a good step coverage characteristic. However, the pixel-defining layer 270 may have a mushroom structure in which an upper portion is wider than a lower portion, as in the example of FIG. 7D. Thus, even when the reflective electrode 266 and the first electrode 261 are formed through the PVD process, such as the sputtering process, that has a good step coverage characteristic, the reflective electrode 266 and the first electrode 261 may be disconnected (or discontinuous) in a boundary between the first and second pixel-defining layers 271 and 272.

Moreover, each of red pixels RP, green pixels GP, and blue pixels BP may be defined as an area in which a first electrode, an organic light-emitting layer, and a second electrode may be sequentially stacked to emit light. An area corresponding to each of the red pixel RP, the green pixel GP, and the blue pixel BP may be defined by the first electrode 261. That is, a size of each of the red pixel RP, the green pixel GP, and the blue pixel BP may be automatically determined along with forming the first electrode 261.

The reflective electrode 266 may be formed, for example, of a metal material, which may be high in reflectivity, such as Al, Ag, or an APC alloy. The first electrode 261 may be formed of a transparent metal material (TCO), such as ITO or IZO, which may transmit light. Subsequently, as in the FIG. 7E example, the reflective electrode 266 and the first electrode 261 formed on the pixel-defining layer 272 may be etched.

Figure 7F:
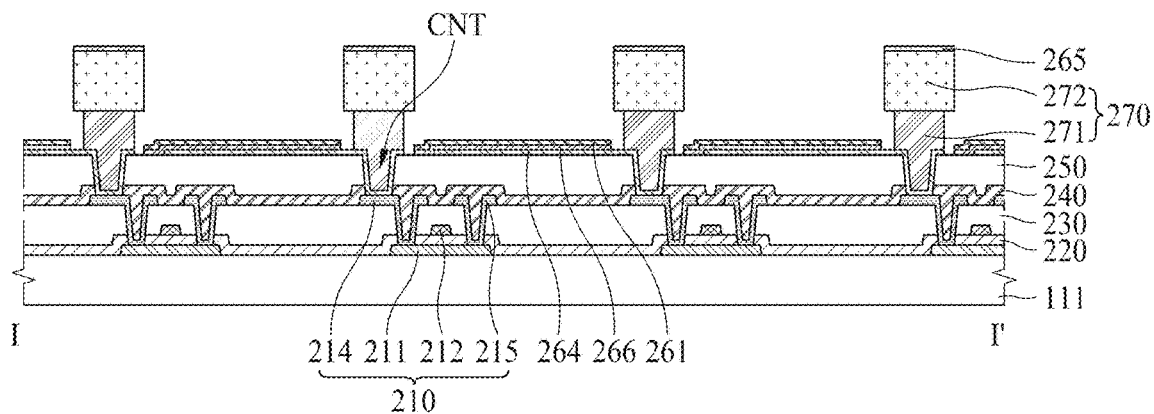

In operation S105 of FIG. 6 and in the FIG. 7F example, a light-absorbing layer 265 may be formed on the second pixel-defining layer 272. The light-absorbing layer 265 may be formed of, e.g., a stacked structure (Mo/Ti) of Mo and Ti. In an example in which the second pixel-defining layer 272 includes a light absorbing material, the light-absorbing layer 265 may be omitted.

Figure 7G:
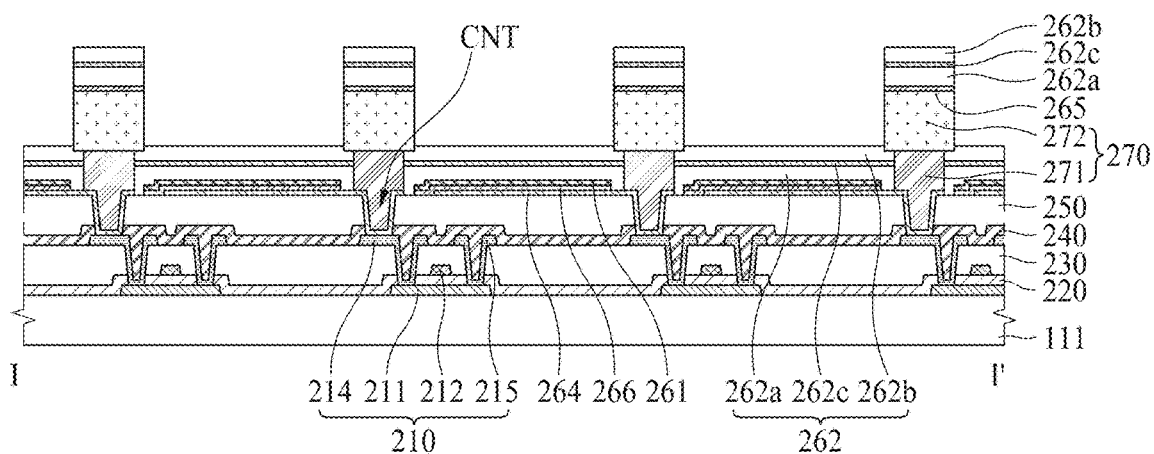

In operation S106 of FIG. 6 and in the FIG. 7G example, an organic light-emitting layer 262 may be formed on the first electrode 261 and the pixel-defining layer 270. The organic light-emitting layer 262 may be formed, for example, in a deposition process or a solution process. In an example in which the organic light-emitting layer 262 is formed in the deposition process, the organic light-emitting layer 262 may be formed in an evaporation process.

The organic light-emitting layer 262 may be a common layer that may be formed in the pixels RP, GP, and BP in common, and may be a white light-emitting layer that may emit white light. In one example, as in FIG. 7F, the organic light-emitting layer 262 may be formed in a tandem structure of two or more stacks. Each of stacks 262a and 262b may include a hole transporting layer, at least one light-emitting layer, and an electron transporting layer.

Moreover, a charge generating layer 262c may be formed between the stacks 262a and 262b. The charge generating layer 262c may include an n-type charge generating layer, disposed adjacent to a lower stack. The charge generating layer 262c may further include a p-type charge generating layer that may be formed on the n-type charge generating layer, and may be disposed adjacent to an upper stack. The n-type charge generating layer may inject an electron into the lower stack, and the p-type charge generating layer may inject a hole into the upper stack. The n-type charge generating layer may be formed of an organic layer which may be doped, e.g., with an alkali metal, such as lithium (Li), sodium (Na), potassium (K), or cesium (Cs); or with an alkali earth metal, such as magnesium (Mg), strontium (Sr), barium (Ba), or radium (Ra). The p-type charge generating layer may be an organic layer that may be formed by doping a dopant on an organic host material having an ability to transport holes.

However, embodiments of the present disclosure are not limited to a case in which the organic light-emitting layer 262 is formed as a common layer that is formed in common in the red pixel RP, the green pixel GP, and the blue pixel BP. That is, the organic light-emitting layer 262 according to an embodiment of the present disclosure may include a red organic light-emitting layer that may be disposed in correspondence with the red pixel RP to emit red light, a green organic light-emitting layer that may be disposed in correspondence with the green pixel GP to emit green light, and a blue organic light-emitting layer that may be disposed in correspondence with the blue pixel BP to emit blue light. In this case, the color filters 291, 292, and 293 may be omitted.

A layer formed in the evaporation process may not have a good step coverage characteristic. Therefore, a thickness of the organic light-emitting layer 262 formed on each of side surfaces of the second pixel-defining layer 272 may be thinner than that of the organic light-emitting layer 262 formed on the first electrode 261. If a height H2 of the charge generating layer 262c of the organic light-emitting layer 262 is set lower than a height H1 of the first pixel-defining layer 271, the charge generating layer 262c formed on the first electrode 261 may be disconnected (or discontinuous) from the charge generating layer 262c formed on each of the side surfaces of the second pixel-defining layer 272.

In an embodiment of the present disclosure, because the organic light-emitting layer 262 is formed in the pixels RP, GP, and BP in common, a current of one pixel can be leaked to an adjacent pixel through the charge generating layer 262c of the organic light-emitting layer 262. However, according to an embodiment of the present disclosure, because the height H2 of the charge generating layer 262c of the organic light-emitting layer 262 may be set lower than the height H1 of the first pixel-defining layer 271, the charge generating layer 262c of the organic light-emitting layer 262 may be disconnectedly (or discontinuously) provided in the second pixel-defining layer 272. Accordingly, in an embodiment of the present disclosure, an adjacent pixel may be prevented from being affected (or may be less affected) by a leakage current leaked through the charge generating layer 262c of the organic light-emitting layer 262. Also, in an area other than the first electrode 261, the organic light-emitting layer 262 may be prevented from emitting light (or may reduce less light) due to a leakage of a current.

Figure 7H:
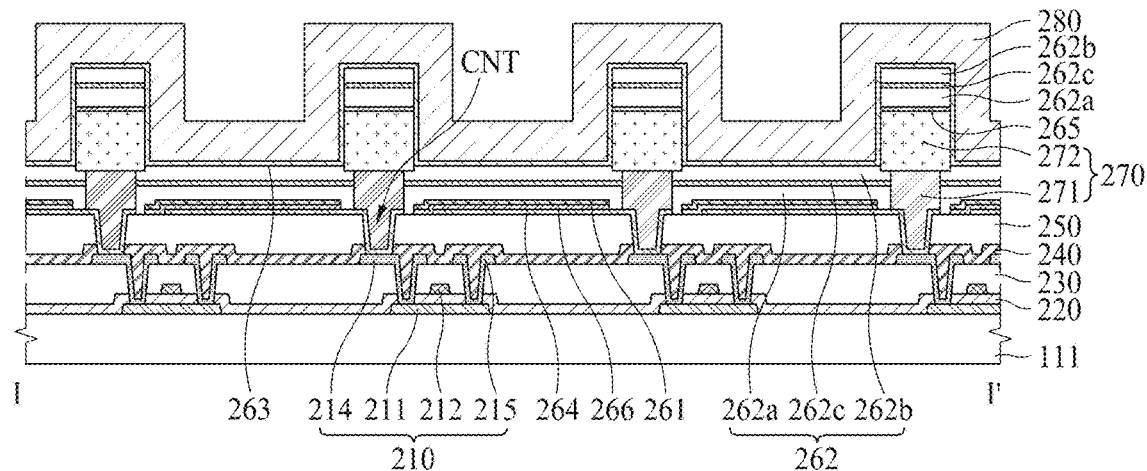

In operation S107 of FIG. 6 and in the FIG. 7H example, a second electrode 263 and an encapsulation layer 280 may be sequentially formed on the organic light-emitting layer 262. The second electrode 263 may be a common layer that may be formed in the pixels RP, GP, and BP in common. The second electrode 263 may be formed, for example, through a PVD process, such as a sputtering process. A layer formed in the PVD process, such as the sputtering process, may have a good step coverage characteristic. Therefore, even in a case in which the second pixel-defining layer 272 is formed in a vertical structure or a taper structure, the second electrode 263 may be continuously connected without being disconnected (or discontinuous) in the second pixel-defining layer 272.

The second electrode 263 may be formed, e.g., of a transparent conductive material (or TCO), such as indium tin oxide (ITO) or indium zinc oxide (IZO) capable of transmitting light, or of a semi-transmissive conductive material, such as Mg, Ag, or an alloy of Mg and Ag.

Subsequently, the encapsulation layer 280 may be formed on the second electrode 263. The encapsulation layer 280 may reduce or prevent oxygen or water from penetrating into the organic light-emitting layer 262 and the second electrode 263. To this end, the encapsulation layer 280 may include at least one inorganic layer and at least one organic layer.

Figure 7I:
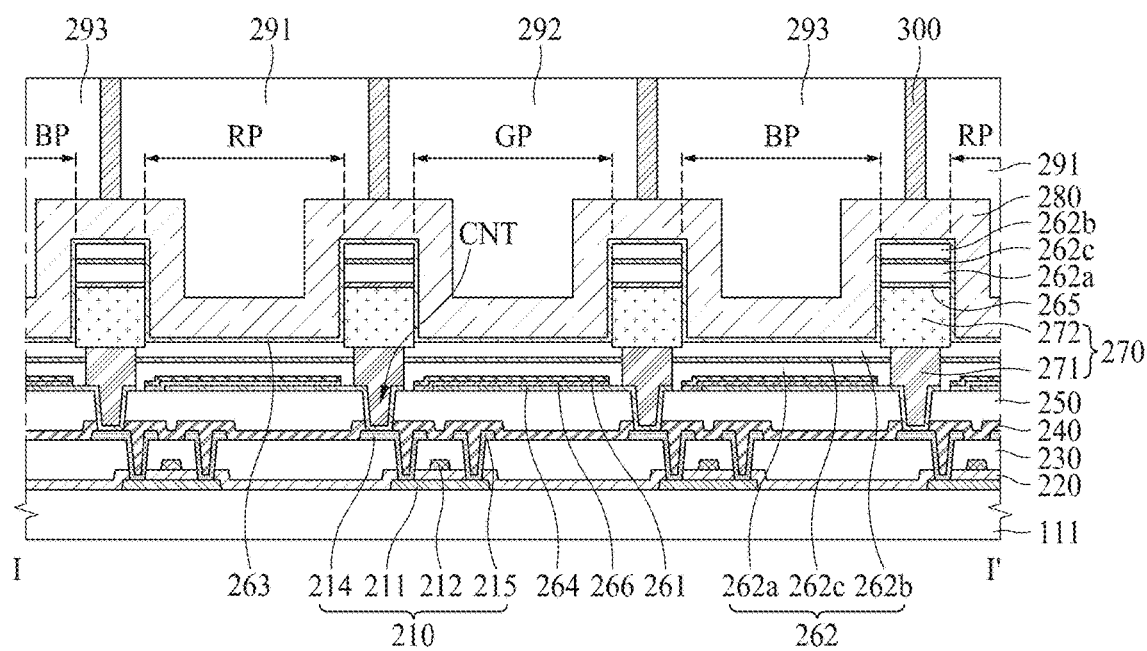

In operation S108 of FIG. 6 and as in the FIG. 7I example, the color filters 291, 292, and 293 may be formed on the encapsulation layer 280. In detail, a red color filter 291 may be disposed in correspondence with the red pixel RP, a green color filter 292 may be disposed in correspondence with the green pixel GP, and a blue color filter 293 may be disposed in correspondence with the blue pixel BP.

A low refractive index medium layer 300 may divide the red, green, and blue color filters 291, 292, and 293. The low refractive index medium layer 300 may divide the red, green, and blue color filters 291, 292, and 293. The low refractive index medium layer 300 may be disposed to overlap the pixel-defining layer 270.

A refractive index of the low refractive index medium layer 300 may be lower than that of each of the red, green, and blue color filters 291, 292, and 293. For example, the red, green, and blue color filters 291, 292, and 293 may each be formed of an organic material, and in one example, may have a refractive index of 1.5 or more. The low refractive index medium layer 300 may have a refractive index that is lower than 1.5. For example, the low refractive index medium layer 300 may be an air layer, and in one example, may have a refractive index of 1.0.

Figure 9:
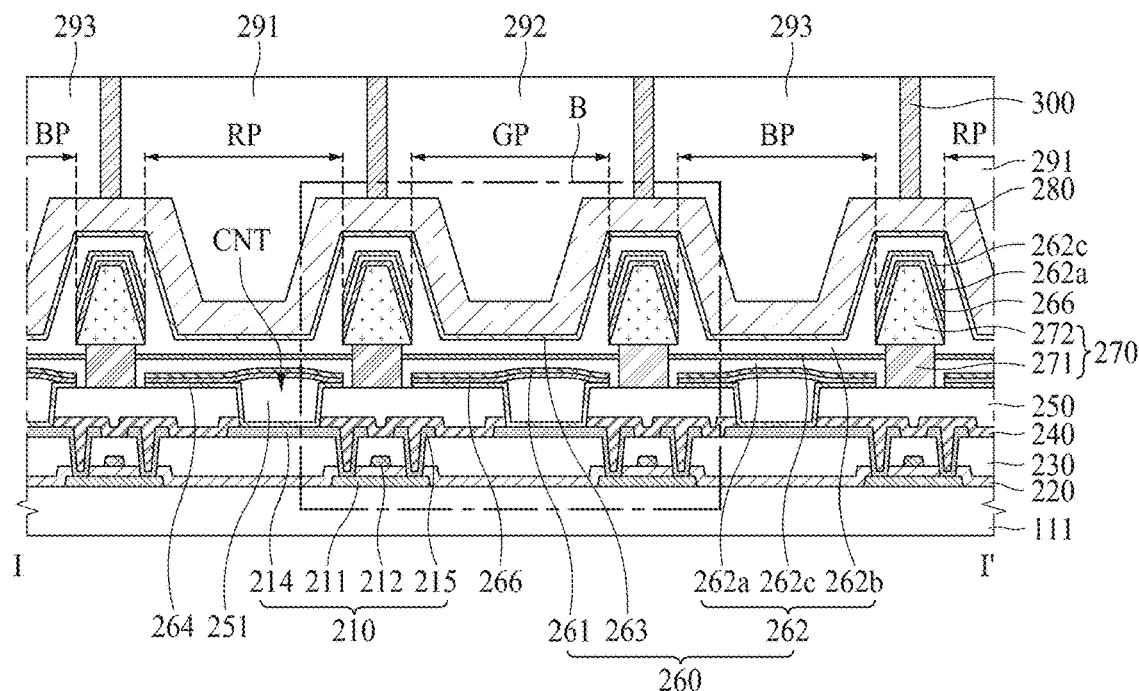
FIG. 9 is a cross-sectional view illustrating in detail another example taken along line I-I' of FIG. 3.
Figure 10:
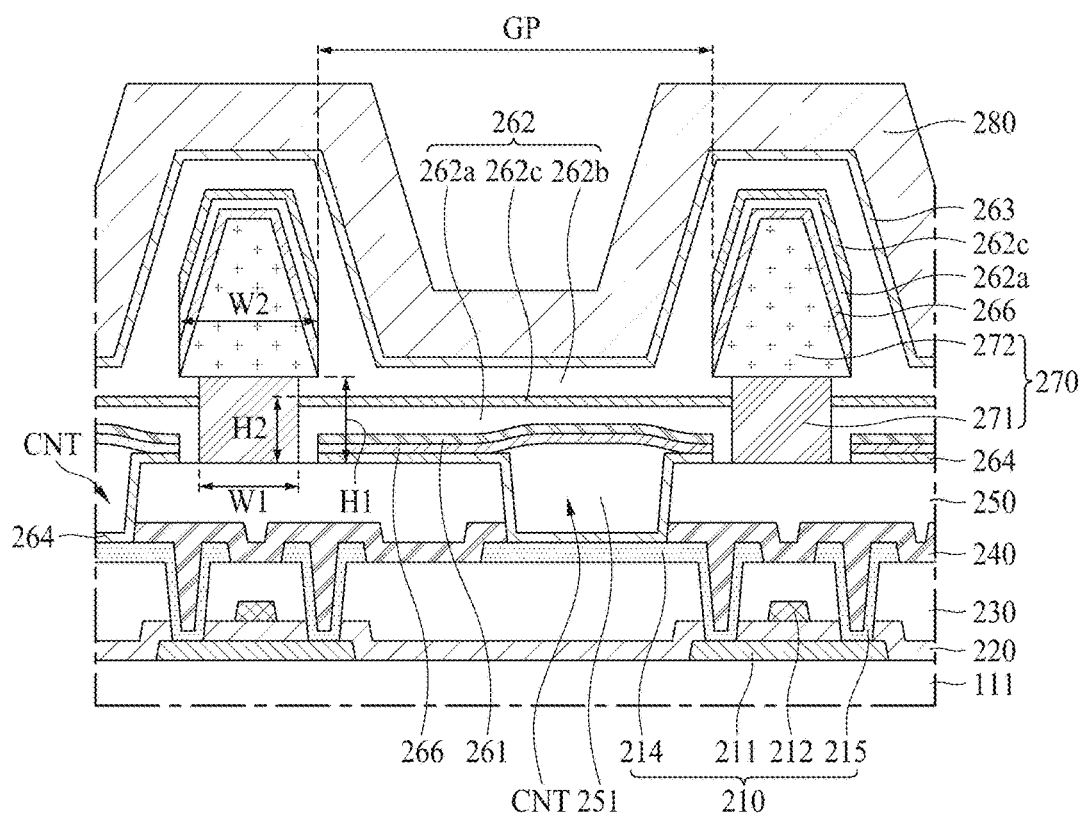
FIG. 10 is an enlarged view of area B of FIG. 9.

FIG. 9 is a cross-sectional view illustrating in detail another example taken along line I-I' of FIG. 3. FIG. 10 is an enlarged view of area B of FIG. 9.

Except for a contact hole CNT overlapping each of a plurality of pixels RP, GP, and BP and a second pixel-defining layer 272 formed in a taper structure, the organic light-emitting display device illustrated in the examples of FIGS. 9 and 10 are substantially similar to the organic light-emitting display device described above with reference to the examples of FIGS. 4 and 5. Hereinafter, therefore, only a first planarization layer 250, an auxiliary electrode 264, a second planarization layer 251, a first electrode 261, and a pixel-defining layer 270 will be described in detail with reference to the examples of FIGS. 9 and 10, and detailed descriptions of the other elements are omitted for convenience.

A first planarization layer 250 for planarizing a step height caused by a TFT 210 may be formed on the passivation layer 240. The first passivation layer 250 may be formed, e.g., of an organic layer, such as acryl resin, epoxy resin, phenolic resin, polyamide resin, polyimide resin, or the like.

A contact hole CNT, which may pass through the passivation layer 240 and the first planarization layer 250 to expose a drain electrode 214 of the TFT 210, may be formed. The contact hole CNT, as illustrated in FIG. 10, may be formed to overlap each of the pixels RP, GP, and BP.

The auxiliary electrode 264 may be formed on the first planarization layer 250. The auxiliary electrode 264 may be connected to a source electrode 215 or the drain electrode 214 of the TFT 210 through the contact hole CNT. The auxiliary electrode 264 may be formed of a transparent metal material or an opaque metal material. The transparent metal material may be, e.g., a transparent conductive material (TCO), such as indium tin oxide (ITO) or indium zinc oxide (IZO); or a semi-transmissive conductive material, such as magnesium (Mg), silver (Ag), or an alloy of Mg and Ag. The opaque metal material may be, e.g., aluminum (Al), molybdenum (Mo), a stacked structure (Mo/Ti) of Mo and titanium (Ti), copper (Cu), or a stacked structure (Ti/Al/Ti) of Al and Ti.

The second planarization layer 251 may be formed on the auxiliary electrode 264 in the contact hole CNT. If the contact hole CNT is not filled with the second planarization layer 251, the organic light-emitting layer 262 may be non-uniformly formed in the contact hole CNT. Thus, the first electrode 261 may be short-circuited with the second electrode 263 or a charge generating layer 262c of the organic light-emitting layer 262. Therefore, the second planarization layer 251 may fill the contact hole CNT, for planarizing a step height caused by the contact hole CNT. The second passivation layer 251 may be formed, e.g., of an organic layer, such as acryl resin, epoxy resin, phenolic resin, polyamide resin, polyimide resin, or the like. A reflective electrode 266, a first electrode 261, an organic light-emitting device 260, and a pixel-defining layer 270 may be formed on the second planarization layer 251.

The pixel-defining layer 270 may be formed on the first planarization layer 250, for dividing the pixels RP, GP, and BP. That is, the pixel-defining layer 270 may define the pixels RP, GP, and BP. Also, an area where the pixel-defining layer 270 is provided may not emit light. Thus, the pixel-defining layer 270 may be defined as a non-emissive area.

The pixel-defining layer 270 may include a first pixel-defining layer 271 and a second pixel-defining layer 272. The first pixel-defining layer 271 may be disposed on the first planarization layer 250. The second pixel-defining layer 272 may be disposed on the first pixel-defining layer 271.

A width W2 of the second pixel-defining layer 272 may be set wider than a width W1 of the first pixel-defining layer 271. That is, the pixel-defining layer 270 may have a mushroom structure in which an upper portion is wider than a lower portion. Moreover, the first pixel-defining layer 271 and the second pixel-defining layer 272 may be formed of different materials. For example, the first pixel-defining layer 271 may be formed of $SiO_x$, and the second pixel-defining layer 272 may be formed of $SiN_x$.

Moreover, the second pixel-defining layer 272 may have a structure in which a lower portion is wider than an upper portion. That is, the second pixel-defining layer 272 may have a taper structure. The taper structure may denote a structure in which an angle between a bottom and a side of the second pixel-defining layer 272 is 0° (degrees) to 90° (degrees). However, a structure of the second pixel-defining layer 272 is not limited to the taper structure, and the second pixel-defining layer 272 may be formed in a vertical structure, as in the examples of FIGS. 4 and 5. The vertical structure may denote a structure where the angle between the bottom and the side of the second pixel-defining layer 272 is 90° (degrees).

Moreover, the second pixel-defining layer 272 may include a light absorbing material that absorbs light. Therefore, light of the organic light-emitting layer traveling in a horizontal direction may be absorbed by the light absorbing material. Accordingly, in an embodiment of the present disclosure, light emitted from the organic light-emitting layer of one pixel may be prevented from traveling (or less light may travel) to an adjacent pixel, thereby reducing or preventing color mixture.

The organic light-emitting device 260 may include the first electrode 261, the organic light-emitting layer 262, and the second electrode 263. The first electrode 261 may be an anode electrode, and the second electrode 263 may be a cathode electrode.

The reflective electrode 266 may be formed on the auxiliary electrode 264 and the second planarization layer 251. The first electrode 261 may be formed on the reflective electrode 266. The first electrode 261 may be electrically connected to the drain electrode 214 of the TFT 210 through the reflective electrode 266 and the auxiliary electrode 264. In this case, due to the auxiliary electrode 264, a resistance of the first electrode 261 may be lowered more.

In the related art, because the pixel-defining layer 270 covers an edge of the first electrode 261, a size of each of the pixels RP, GP, and BP is reduced due to the pixel-defining layer 270. However, in an embodiment of the present disclosure, because the pixel-defining layer 270 may not cover an edge of the first electrode 261, there may be no area damaged by the pixel-defining layer 270 in each of the pixels RP, GP, and BP. Accordingly, in an embodiment of the present disclosure, a size of each of the pixels RP, GP, and BP may be maximized.

The reflective electrode 266 and the first electrode 261 may be formed on the auxiliary electrode 264 without being covered by the first pixel-defining layer 271. That is, the reflective electrodes 266 and the first electrodes 261 may be may be divided by the first pixel-defining layer 271. The reflective electrode 266 may be formed, e.g., of a metal material, which may be high in reflectivity, such as Al, Ag, or an APC alloy. The first electrode 261 may be formed, e.g., of a transparent metal material (TCO), such as ITO or IZO, which transmits light.

The reflective electrode 266 and the first electrode 261 may be formed on the second pixel-defining layer 272. Therefore, light of the organic light-emitting layer 262 traveling to the second pixel-defining layer 272 may be reflected by a reflective electrode 266 formed on the second pixel-defining layer 272, and may be output to the outside. Accordingly, in an embodiment of the present disclosure, a luminance of light emitted from each of the red pixel RP, the green pixel GP, and the blue pixel BP may increase. The first electrode 261 may not be provided on the second pixel-defining layer 272.

Figure 11:
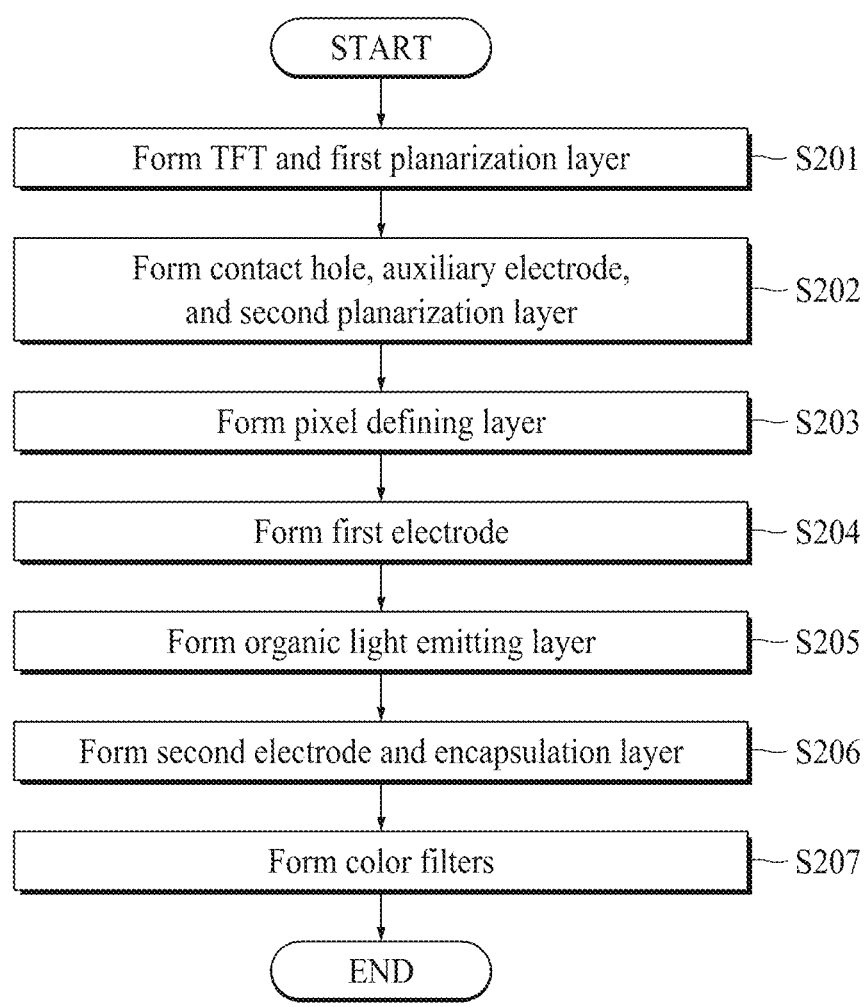
FIG. 11 is a flowchart illustrating a method of manufacturing an organic light-emitting display device according to an embodiment of the present disclosure.

FIG. 11 is a flowchart illustrating a method of manufacturing an organic light-emitting display device according to an embodiment of the present disclosure. FIGS. 12A to 12G are cross-sectional views illustrating a method of manufacturing an organic light-emitting display device according to an embodiment of the present disclosure, based on the flowchart of FIG. 11.

Operation S201 of FIG. 11 is substantially similar to operation S101 of FIG. 6. Thus, a detailed description of operation S201 of FIG. 11 is omitted for convenience. Because the features of FIG. 12A were substantially described above, a detailed description thereof is also omitted for convenience.

Figure 12A:
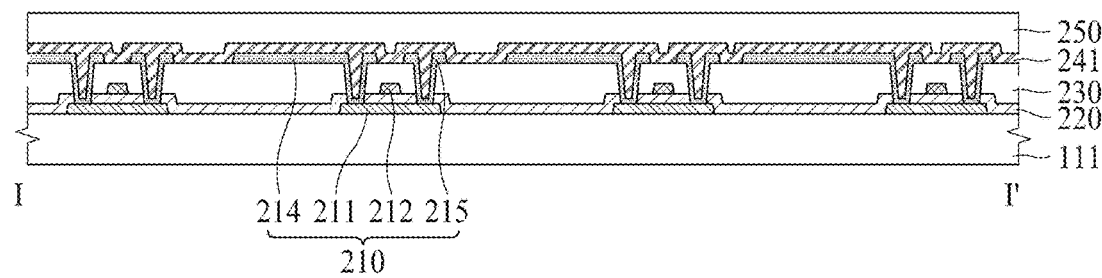
FIGS. 12A to 12G are cross-sectional views illustrating a method of manufacturing an organic light-emitting display device according to an embodiment of the present disclosure, based on the flowchart of FIG. 11.
Figure 12B:
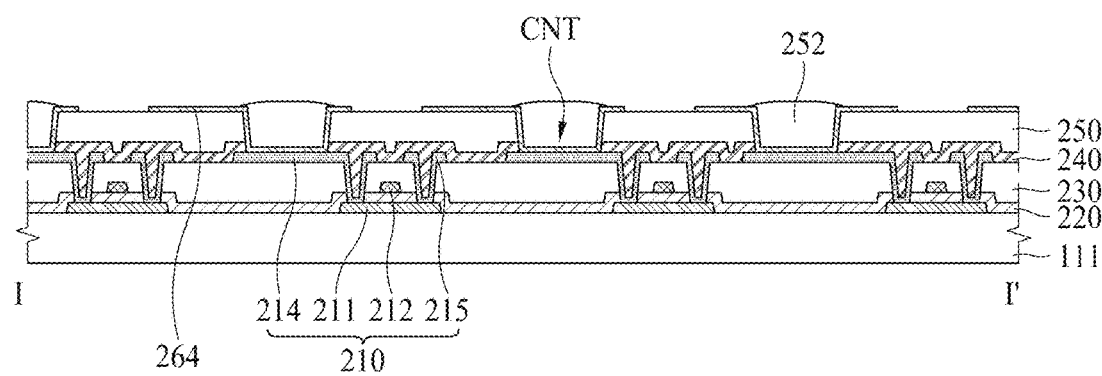
Figure 13A:
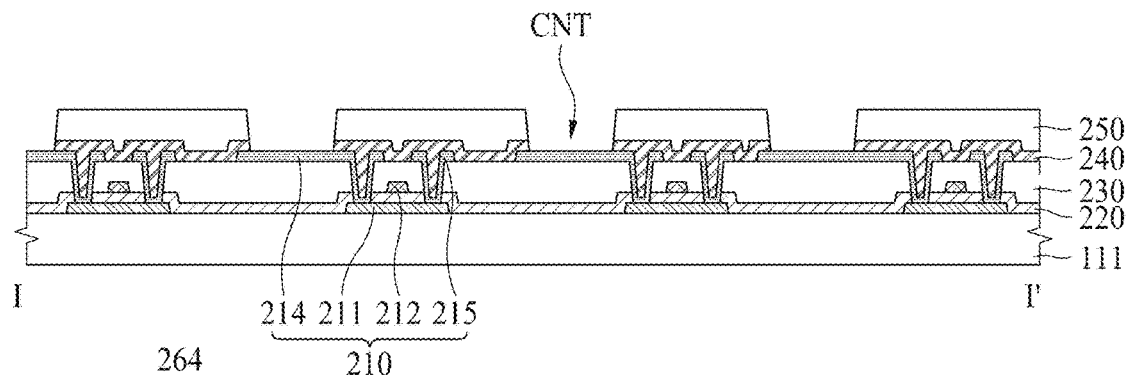
FIGS. 13A to 13C are cross-sectional views illustrating in detail an operation of FIG. 11.

In operation S202 of FIG. 11 and in the FIG. 12B example, a contact hole CNT, an auxiliary electrode 264, and a second planarization layer 251 may be formed. A method of forming the contact hole CNT, the auxiliary electrode 264, and the second planarization layer 251 will be described in detail with reference to FIGS. 13A to 13C. The contact hole CNT, which may pass through a passivation layer 240 and a first planarization layer 250 to expose a source electrode 215 or a drain electrode 214 of a TFT 210, may be formed.

Figure 13B:
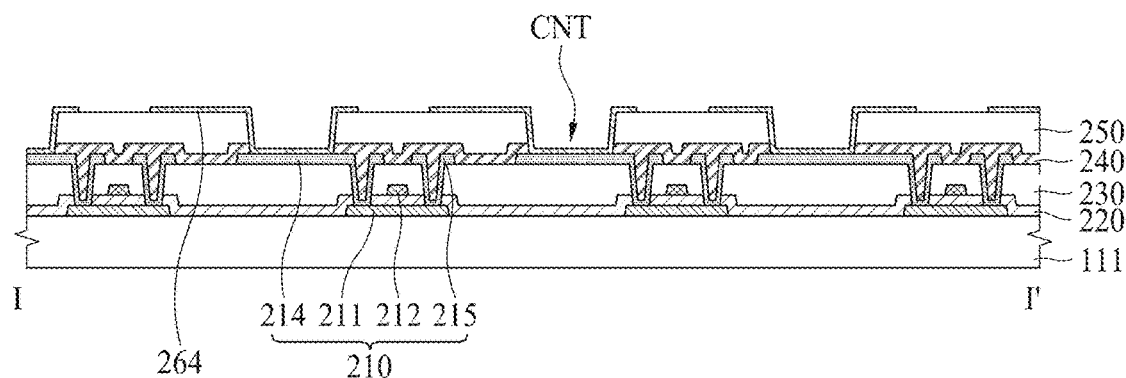

Subsequently, as in the FIG. 13B example, the auxiliary electrode 264 may be formed on the first planarization layer 250. The auxiliary electrode 264 may be connected to the source electrode 215 or the drain electrode 214 of the TFT 210 through the contact hole CNT.

The auxiliary electrode 264 may be formed, for example, through a PVD process, such as a sputtering process. The auxiliary electrode 264 may be formed of a transparent metal material or an opaque metal material. The transparent metal material may be, e.g., a transparent conductive material (TCO), such as indium tin oxide (ITO) or indium zinc oxide (IZO); or a semi-transmissive conductive material, such as magnesium (Mg), silver (Ag), or an alloy of Mg and Ag. The opaque metal material may be, e.g., aluminum (Al), molybdenum (Mo), a stacked structure (Mo/Ti) of Mo and titanium (Ti), copper (Cu), or a stacked structure (Ti/Al/Ti) of Al and Ti.

Figure 13C:
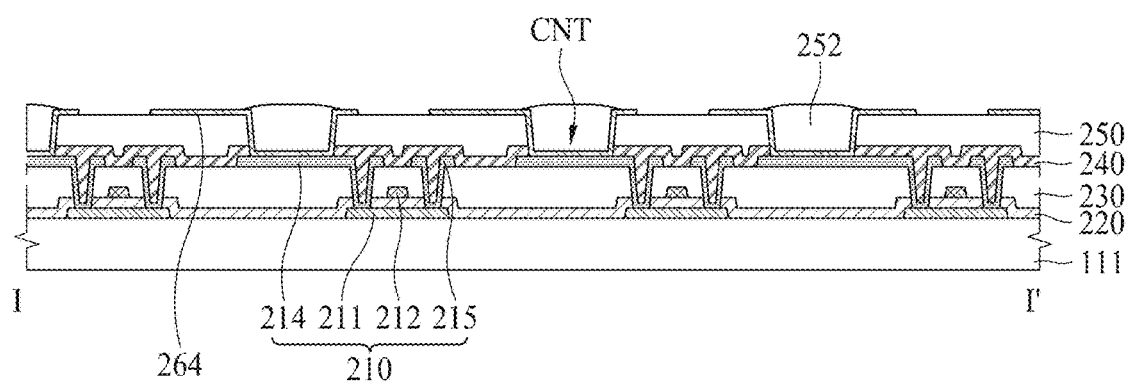

Subsequently, as in the FIG. 13C example, the second planarization layer 251 may be formed on the auxiliary electrode 265. The second planarization layer 251 may fill the contact hole CNT, for planarizing a step height caused by the contact hole CNT.

For example, an organic material may be coated on the first planarization layer 260 and the auxiliary electrode 265. The organic material may be, for example, acryl resin, epoxy resin, phenolic resin, polyamide resin, polyimide resin, or the like. The organic material may be coated on the first planarization layer 260 and the auxiliary electrode 265, e.g., using a slit coating process, a spin coating process, an evaporation process, or the like. The organic material may fill the contact hole CNT. Subsequently, a mask M may be located on the contact hole CNT, and then, the organic material which is provided in an area where the mask M is located may be developed. As a result, the second planarization layer 251 may be formed to cover the contact hole CNT.

Figure 12C:
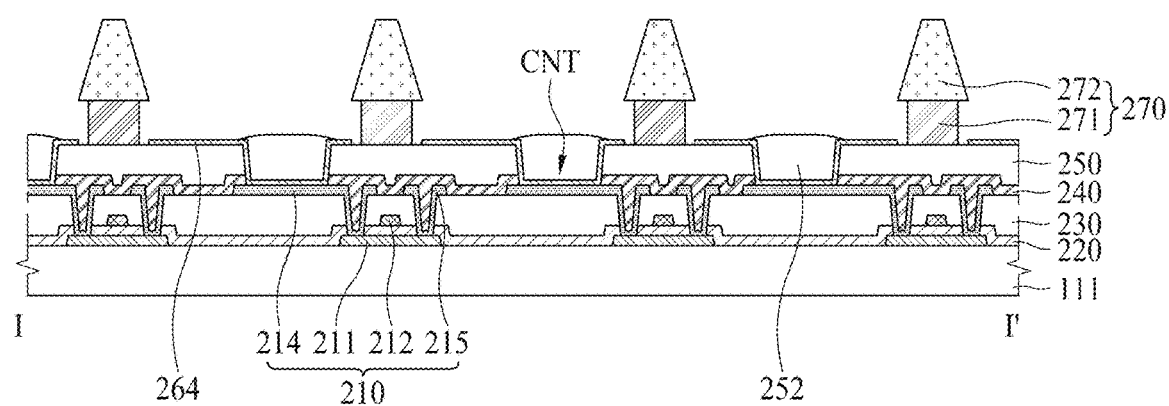

In operation S203 of FIG. 11 and in the example of FIG. 12C, a pixel-defining layer 270 may be formed in the first planarization layer 250. A method of forming the pixel-defining layer 270 will be described in detail with reference to FIGS. 14A to 14D.

Figure 14A:
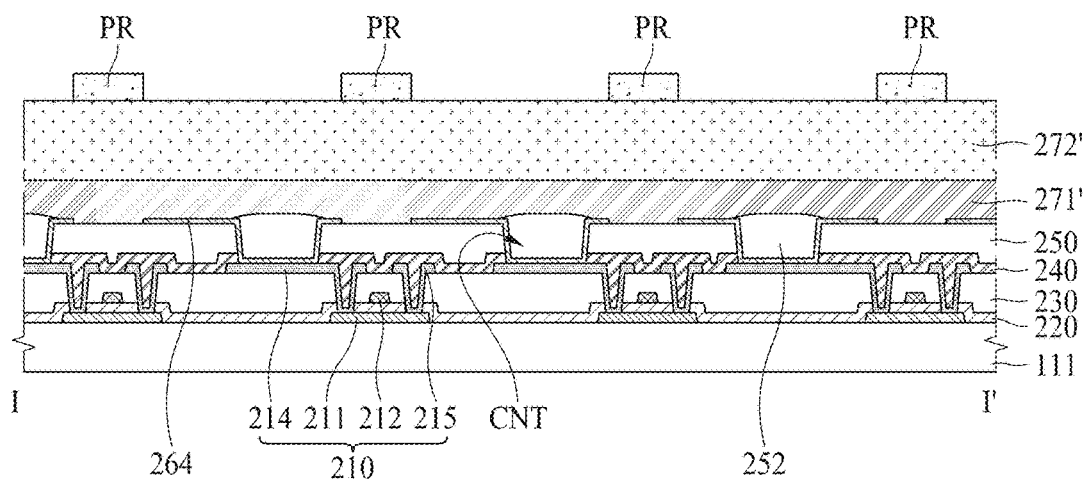
FIGS. 14A to 14C are cross-sectional views illustrating in detail an operation of FIG. 11.

In FIG. 14A, a first inorganic layer 271' and a second inorganic layer 272' may be formed on the first planarization layer 250. The first inorganic layer 271' may be formed of $SiO_x$, and the second inorganic layer 272' may be formed of $SiN_x$. Also, a photoresist pattern PR may be formed on the second inorganic layer 272' in an area in which the pixel-defining layer 270 is to be formed.

Figure 14B:
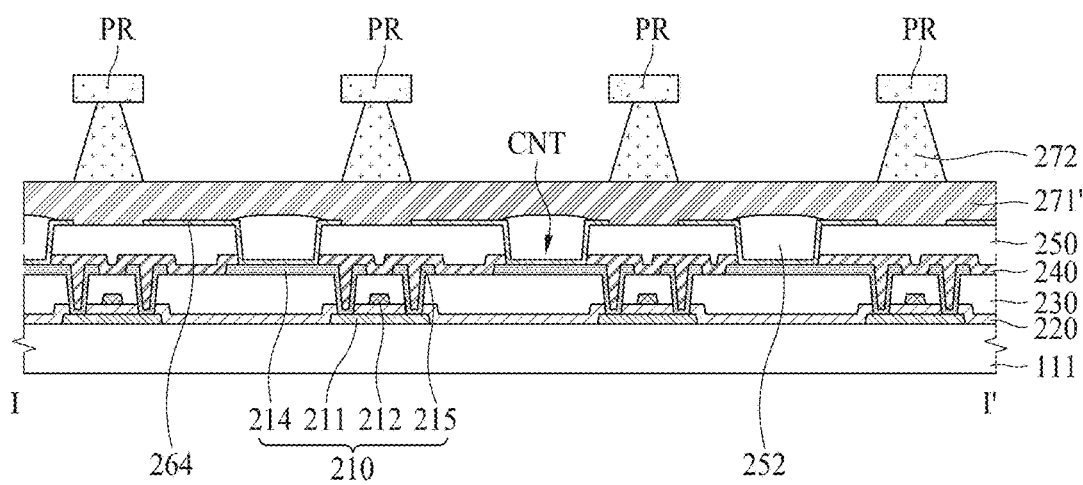

Subsequently, as in the FIG. 14B example, the second pixel-defining layer 272 may be formed, for example, through a dry etching process. A gas applied to the dry etching process may be a gas that etches only the second inorganic layer 272' without etching the first inorganic layer 271'.

A high frequency inductive coupled plasma apparatus may distribute the gas into a chamber through a gas supply means, may apply a first radio frequency (RF) power to a power supply unit disposed over a substrate, and may apply a second RF power to a power supply unit disposed under the substrate, thereby performing an anisotropic etching process on the second inorganic layer 272' using a physical impact between ions. That is, the high frequency inductive coupled plasma apparatus may individually control ion energy applied to the second inorganic layer 272'. Accordingly, in an embodiment of the present disclosure, by performing the anisotropic etching process with the high frequency inductive coupled plasma apparatus, the second pixel-defining layer 272 may be formed in a vertical structure or in a taper structure.

Figure 14C:
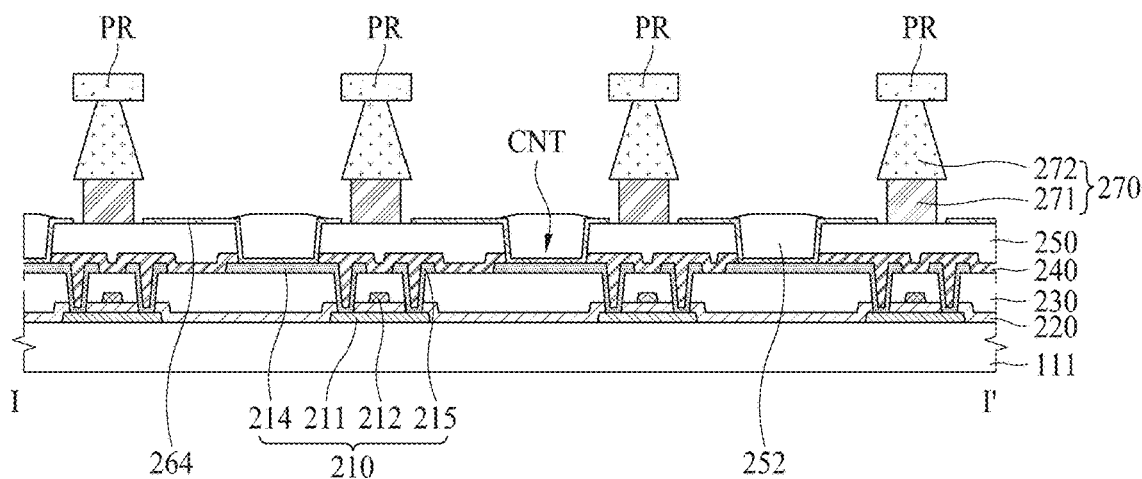

Subsequently, as in the FIG. 14C example, a first pixel-defining layer 271 may be formed by etching the first inorganic layer 271' with the second pixel-defining layer 272 as a mask. A process of etching the first inorganic layer 271' may use both a dry etching process and a wet etching process. A gas applied to the dry etching process for the first inorganic layer 271' may be a gas that etches only the first inorganic layer 271' without etching the second pixel-defining layer 272. Also, an etchant applied to the wet etching process for the first inorganic layer 271' may be a solution that etches only the first inorganic layer 271' without etching the second pixel-defining layer 272. In a case of etching the first inorganic layer 271' through the wet etching process, a width W2 of the second pixel-defining layer 272 may be easily formed wider than a width W1 of the first pixel-defining layer 271. Subsequently, the photoresist pattern PR, which may remain on the second pixel-defining layer 272 after the first pixel-defining layer 271 is formed, may be removed.

Figure 12D:
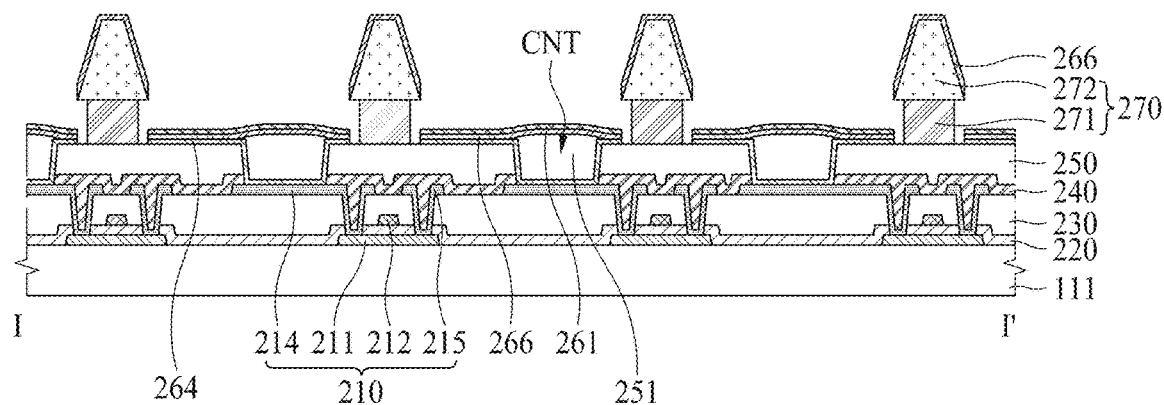
Figure 12E:
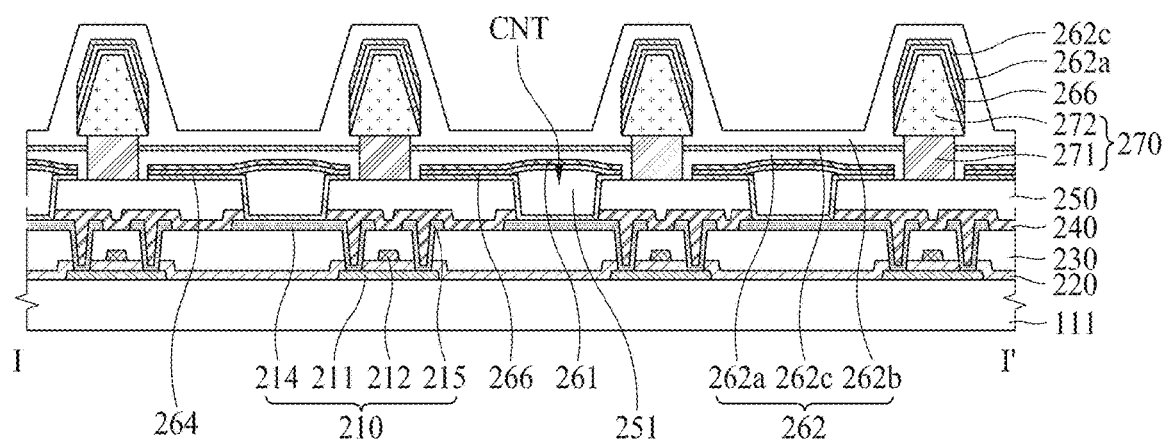
Figure 12F:
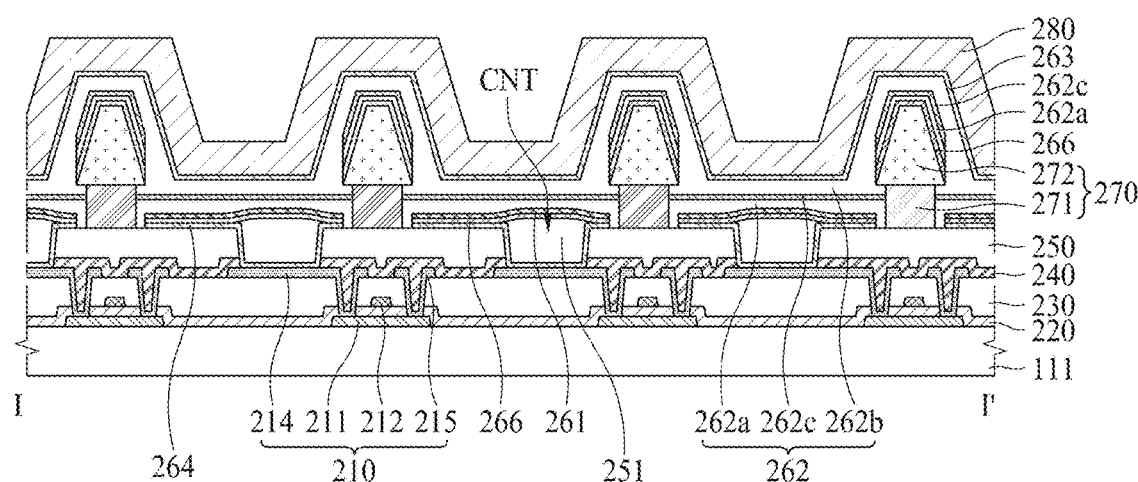
Figure 12G:
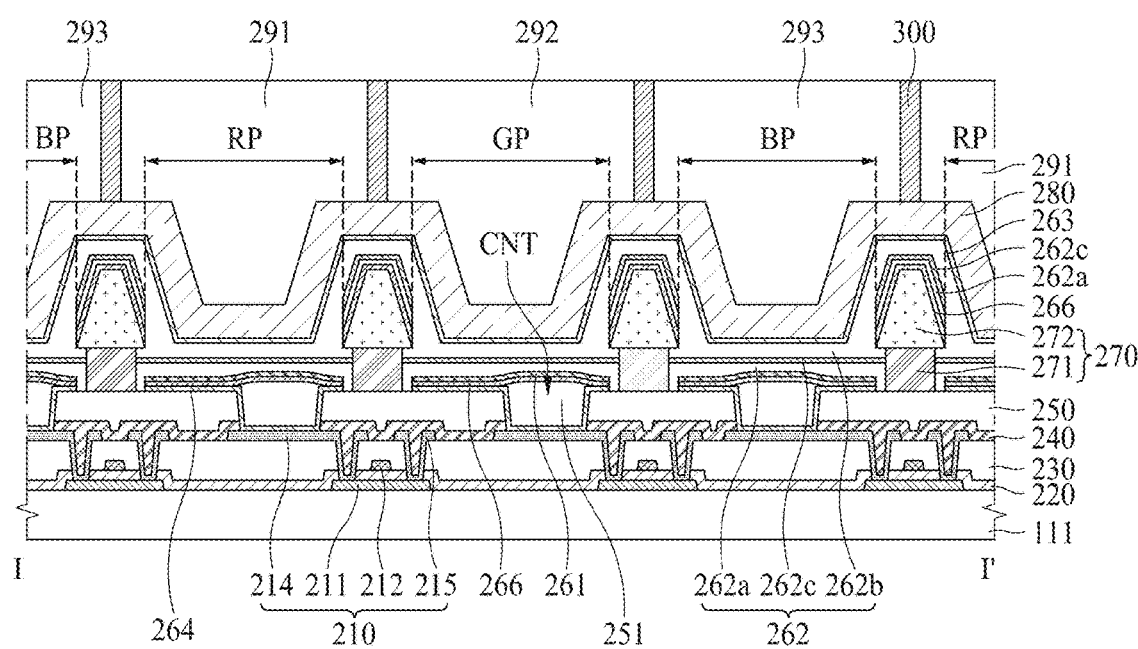

In operation S204 of FIG. 11 and in the FIG. 12D example, a reflective electrode 266 and a first electrode 121 may be formed. For example, using an MOCVD process or a sputtering process, the reflective electrode 266 may be formed on the first and second planarization layers 250 and 251, the auxiliary electrode 264, and the second pixel-defining layer 272 without a mask process using a photoresist pattern. Subsequently, using an MOCVD process or a sputtering process, the first electrode 261 may be formed on the auxiliary electrode 264 without a mask process using a photoresist pattern.

Because the reflective electrode 266 and the first electrode 261 may be formed through a PVD process, such as a sputtering process, the reflective electrode 266 and the first electrode 261 may have a good step coverage characteristic. However, the pixel-defining layer 270 may have a mushroom structure in which an upper portion is wider than a lower portion as in the FIG. 14D example. Thus, even when the reflective electrode 266 and the first electrode 261 are formed through the PVD process, such as the sputtering process, which may have a good step coverage characteristic, the reflective electrode 266 and the first electrode 261 may be disconnected (or discontinuous) in a boundary between the first and second pixel-defining layers 271 and 272.

Moreover, each of red pixels RP, green pixels GP, and blue pixels BP may be defined as an area in which a first electrode, an organic light-emitting layer, and a second electrode may be sequentially stacked to emit light. An area corresponding to each of the red pixel RP, the green pixel GP, and the blue pixel BP may be defined by the first electrode 261. That is, a size of each of the red pixel RP, the green pixel GP, and the blue pixel BP may be automatically determined along with forming the reflective electrode 266 and the first electrode 261.

The reflective electrode 266 may be formed of a metal material, which may be high in reflectivity, such as Al, Ag, or an APC alloy. The first electrode 261 may be formed, e.g., of a transparent metal material (TCO), such as ITO or IZO, which may transmit light.

Operations S205 to S207 of FIG. 11 are substantially similar to operations S106 to S108 of FIG. 6. Thus, detailed descriptions of operations S205 to S207 of FIG. 11 are omitted for convenience. Because the features of FIGS. 12E to 12G were substantially described above, a detailed description thereof is also omitted for convenience.

Figure 15:
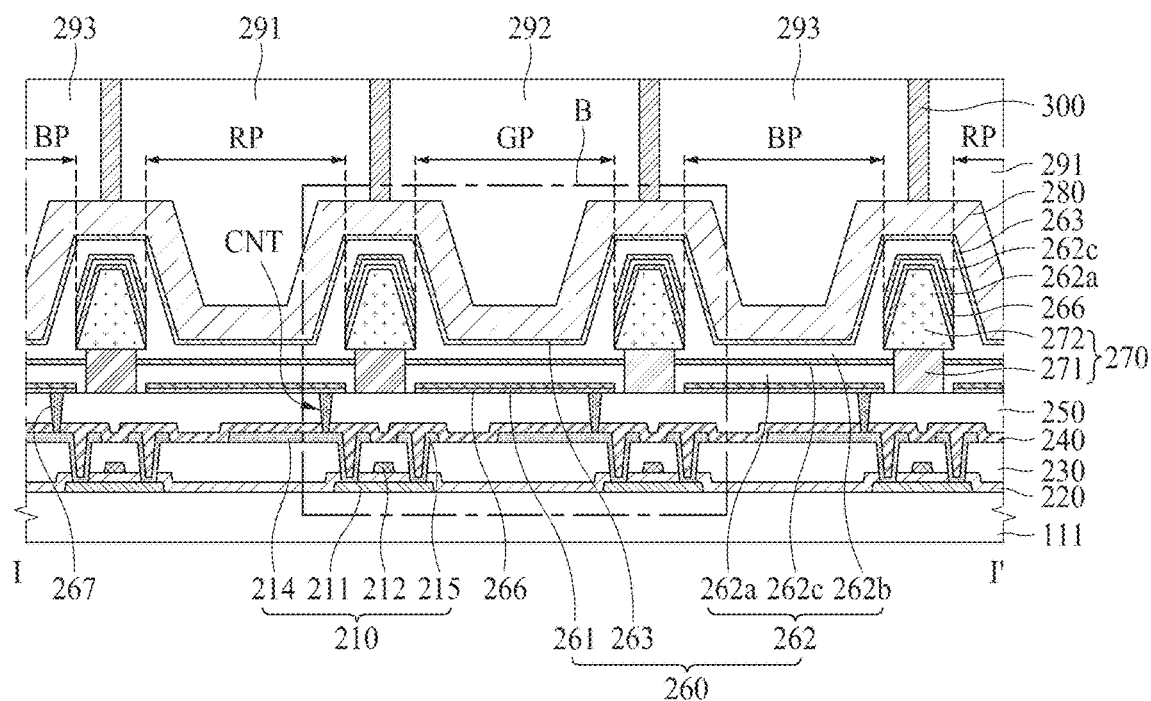
FIG. 15 is a cross-sectional view illustrating in detail another example taken along line I-I' of FIG. 3.

FIG. 15 is a cross-sectional view illustrating in detail another example taken along line I-I' of FIG. 3.

Except that an organic light-emitting display device illustrated in FIG. 15 is an organic light-emitting diode on silicon (OLEDoS) that is formed on a silicon wafer substrate through a semiconductor process, the organic light-emitting display device illustrated in FIG. 15 is substantially similar to the organic light-emitting display device described above with reference to FIG. 9. Therefore, a detailed description of FIG. 15 is omitted for convenience.

With reference to the example of FIG. 15, a via hole 267 may be formed through a semiconductor process, and may be filled with a metal material. That is, the via hole 267 may be filled with the metal material. Therefore, even when the via hole 267 is formed to overlap each of a plurality of pixels RP, GP, and BP, a problem where the organic light-emitting layer 262 is non-uniformly formed due to the via hole 267 may not occur.

Figure 16A:
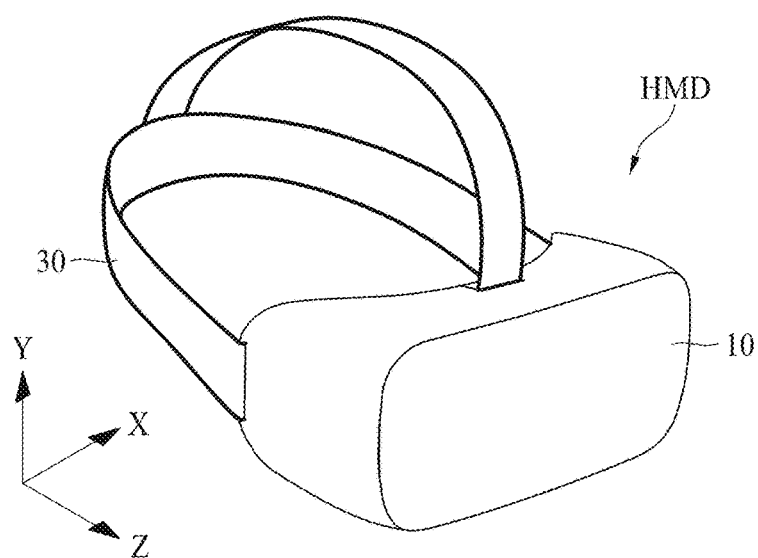
FIGS. 16A and 16B are diagrams illustrating a head-mounted display including an organic light-emitting display device according to an embodiment of the present disclosure.
Figure 16B:
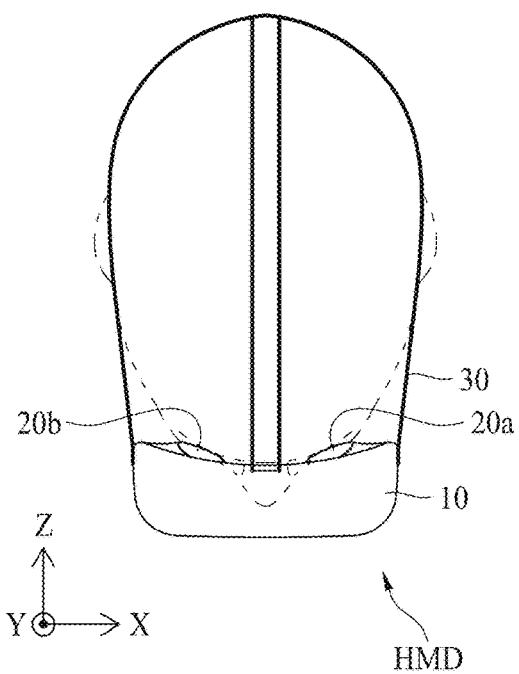

FIGS. 16A and 16B are diagrams illustrating a head-mounted display including an organic light-emitting display device according to an embodiment of the present disclosure.

With reference to the examples of FIGS. 16A and 16B, a head-mounted display HMD including an organic light-emitting display device according to an embodiment of the present disclosure may include a display accommodating case 10, a left-eye lens 20a, a right-eye lens 20b, and a head-mountable band 30.

The display accommodating case 10 may accommodate a display device, and may supply an image displayed by the display device to the left-eye lens 20a and the right-eye lens 20b. The display device may be the organic light-emitting display device according to an embodiment of the present disclosure. The organic light-emitting display device according to an embodiment of the present disclosure has been described above in detail with reference to FIGS. 1 to 15.

The display accommodating case 10 may be designed to supply the same image to the left-eye lens 20a and the right-eye lens 20b. Alternatively, the display accommodating case 10 may be designed so that a left-eye image is displayed on the left-eye lens 20a and a right-eye image is displayed on the right-eye lens 20b.

Figure 17:
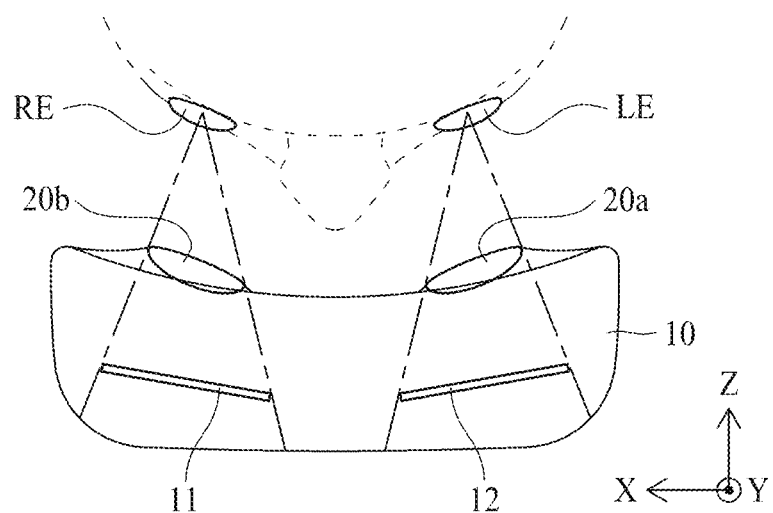
FIG. 17 is a diagram illustrating an example of a display-accommodating case of FIGS. 16A and 16B.

FIG. 17 is a diagram illustrating an example of a display accommodating case of FIGS. 16A and 16B.

As illustrated in the FIG. 17 example, a left-eye organic light-emitting display device 11, disposed in front of the left-eye lens 20a, and a right-eye organic light-emitting display device 12, disposed in front of the right-eye lens 20b may be accommodated into the display accommodating case 10. A structure illustrated in FIG. 17 may be applied, for example, to virtual reality (VR) devices.

FIG. 17 illustrates a cross-sectional view when the display accommodating case 10 is seen from above. The left-eye organic light-emitting display device 11 may display the left-eye image, and the right-eye organic light-emitting display device 12 may display the right-eye image. Therefore, the left-eye image displayed by the left-eye organic light-emitting display device 11 may be visible to a left eye LE of a user through the left-eye lens 20a, and the right-eye image displayed by the right-eye organic light-emitting display device 12 may be visible to a right eye RE of the user through the right-eye lens 20b.

Moreover, in the example of FIG. 17, a magnifying lens may be further provided between the left-eye lens 20a and the left-eye organic light-emitting display device 11 and between the right-eye lens 20b and the right-eye organic light-emitting display device 12. In this case, due to the magnifying lens, an image displayed on each of the left-eye organic light-emitting display device 11 and the right-eye organic light-emitting display device 12 may be magnified and visible to the user.

Figure 18:
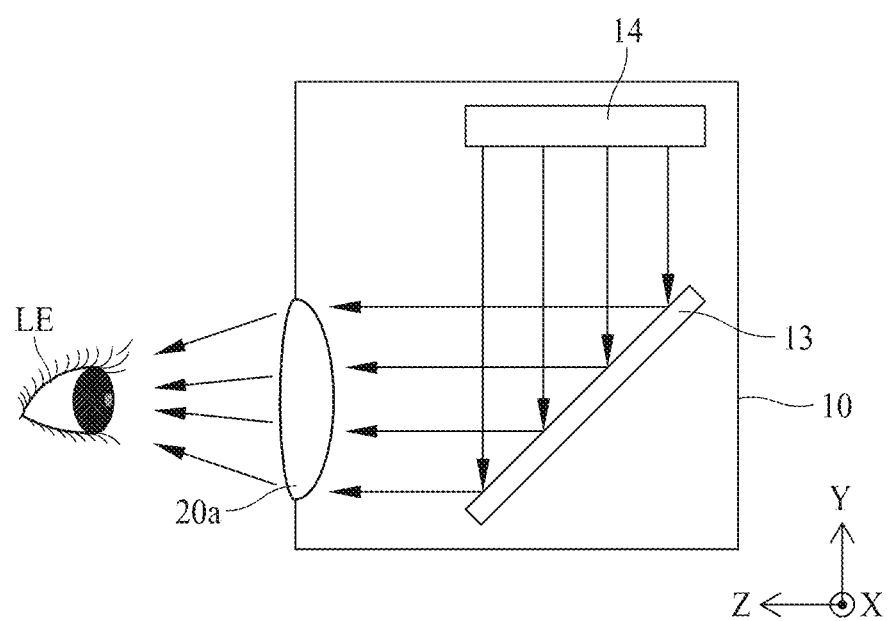
FIG. 18 is a diagram illustrating another example of a display-accommodating case of FIGS. 16A and 16B.

FIG. 18 is a diagram illustrating another example of a display accommodating case of FIGS. 16A and 16B.

In the FIG. 18 example, a half mirror 13 disposed in front of each of the left-eye lens 20a and the right-eye lens 20b and an organic light-emitting display device 14 disposed on the half mirror 13 may be accommodated into the display accommodating case 10. Structure illustrated in FIG. 18 may be applied, for example, to augmented reality (AR) devices.

FIG. 18 illustrates a cross-sectional view when the display accommodating case 10 is seen from the side. The organic light-emitting display device 14 may display an image in a direction toward a mirror reflector 13, and the mirror reflector 13 may totally reflect the image, displayed by the organic light-emitting display device 14, toward the left-eye lens 20a and the right-eye lens 20b. Therefore, the image displayed by the organic light-emitting display device 14 may be supplied to the left-eye lens 20a and the right-eye lens 20b. In FIG. 18, for convenience of description, only the left-eye lens 20a and the left eye LE of the user are illustrated, although the same may be applied to the right-eye lens 20b and the right eye RE of the user. As illustrated in FIG. 18, if the half mirror 13 is used, the display accommodating case 10 may be provided to be thin.

Moreover, in the example of FIG. 18, a magnifying lens may be further provided between the left-eye lens 20a and the half mirror 13 and between the right-eye lens 20b and the half mirror 13. In this case, due to the magnifying lens, an image displayed on each of the left-eye organic light-emitting display device 11 and the right-eye organic light-emitting display device 12 is magnified and visible to the user.

The head-mountable band 30 (FIGS. 16A and 16B) may be fixed to the display accommodating case 10. The head-mountable band 30 is illustrated, by example, as being provided to surround a top and both sides of the user, but is not limited thereto. The head-mountable band 30 may fix the head-mounted display to the head of the user, and may be implemented as a glasses type or a helmet type.

As described above, according to the embodiments of the present disclosure, the first electrodes may be provided between adjacent pixel-defining layers. As a result, in the embodiments of the present disclosure, because the pixel-defining layers may not cover an edge of each of the first electrodes, there may be no area damaged by the pixel-defining layer in each of the pixels. Accordingly, in the embodiments of the present disclosure, a size of each pixel may be maximized.

Moreover, according to the embodiments of the present disclosure, because a height of the charge generating layer of the organic light-emitting layer may be set lower than that of the first pixel-defining layer, the charge generating layer of the organic light-emitting layer may be disconnectedly (or discontinuously) provided in the second pixel-defining layer. Accordingly, in the embodiments of the present disclosure, an adjacent pixel may be prevented from being affected (or may be affected less) by a leakage current leaked through the charge generating layer of the organic light-emitting layer. Also, in an area other than the first electrode, the organic light-emitting layer may be prevented from emitting light (or may emit less light) due to a leakage of a current.

Moreover, according to the embodiments of the present disclosure, the light absorbing material that absorbs light may be added to the second pixel-defining layer, or the light-absorbing layer that absorbs light may be provided in the second pixel-defining layer. In one example, light of the organic light-emitting layer traveling in a horizontal direction may be absorbed by the second pixel-defining layer or the light-absorbing layer. Accordingly, in the embodiments of the present disclosure, light emitted from the organic light-emitting layer of one pixel may be prevented from traveling (or may travel less) to an adjacent pixel, thereby preventing color mixture.

Moreover, according to the embodiments of the present disclosure, the reflective electrode may be provided on the second pixel-defining layer. Therefore, in the embodiments of the present disclosure, light of the organic light-emitting layer traveling to the second pixel-defining layer may be reflected by the reflective electrode provided on the second pixel-defining layer, and may be output to the outside. Accordingly, in the embodiments of the present disclosure, a luminance of light emitted from each of the red, green, and blue pixels may increase.

Moreover, according to the embodiments of the present disclosure, a refractive index of a low refractive index medium layer may be lower than that of each of the red, green, and blue color filters. Therefore, in the embodiments of the present disclosure, light which travels from each of the red, green, and blue color filters to the low refractive index medium layer may be totally reflected and may be output to the outside. Accordingly, in the embodiments of the present disclosure, a luminance of light emitted from each of the red, green, and blue pixels may increase.

It will be apparent to those skilled in the art that various modifications and variations may be made in the present disclosure without departing from the technical idea or scope of the disclosure. Thus, it may be intended that embodiments of the present disclosure cover the modifications and variations of the disclosure provided they come within the scope of the appended claims and their equivalents.

What is claimed is:

1. An organic light-emitting display device, comprising:
   first electrodes;
   a first pixel-defining layer configured to divide the first electrodes;
   a second pixel-defining layer on the first pixel-defining layer;
   an organic light-emitting layer on a first electrode among the first electrodes; and
   a second electrode on the organic light-emitting layer,
   wherein a width of the second pixel-defining layer is wider than a width of the first pixel-defining layer,
   wherein the organic light-emitting layer comprises:
      two or more stacks, each stack comprising:
         a hole transporting layer,
         at least one light-emitting layer, and
         an electron transporting layer, and
      a charge generating layer vertically between the two or more stacks, and
   wherein a height of the charge generating layer is lower than a height of the first pixel-defining layer.

2. The organic light-emitting display device of claim 1, wherein the first electrode:
   is on the second pixel-defining layer; and
   is disconnected in a boundary between the first and second pixel-defining layers.

3. The organic light-emitting display device of claim 1, further comprising a light-absorbing layer on the second pixel-defining layer.

4. The organic light-emitting display device of claim 1, wherein the second pixel-defining layer comprises a material configured to absorb light.

5. The organic light-emitting display device of claim 1, further comprising a reflective electrode under the first electrode.

6. The organic light-emitting display device of claim 5, wherein a portion of the reflective electrode is covered by the first pixel-defining layer.

7. The organic light-emitting display device of claim 6, further comprising:
   a thin film transistor (TFT) on a substrate;
   a planarization layer on the TFT; and
   a contact hole passing through the first planarization layer and configured to expose a source or drain electrode of the TFT,
   wherein the reflective electrode is connected to the source or drain electrode of the TFT through the contact hole, and
   wherein the first pixel-defining layer is in the contact hole.

8. The organic light-emitting display device of claim 5, wherein the reflective electrode is on the second pixel-defining layer.

9. The organic light-emitting display device of claim 1, further comprising:
   an encapsulation layer on the second electrode;
   a plurality of color filters on the encapsulation layer; and
   a low refractive index medium layer between adjacent color filters, the low refractive index medium layer having a refractive index lower than respective refractive indexes of each of the plurality of color filters.

10. The organic light-emitting display device of claim 9, wherein the low refractive index medium layer overlaps the first pixel-defining layer.

11. The organic light-emitting display device of claim 1, further comprising:
    a thin film transistor (TFT) on a substrate;
    a first planarization layer on the TFT;
    a contact hole passing through the first planarization layer and configured to expose a source or drain electrode of the TFT;
    an auxiliary electrode on the first planarization layer, the auxiliary electrode being connected to the source or drain electrode of the TFT through the contact hole; and
    a second planarization layer filling the contact hole, wherein the first electrode is on the second planarization layer and the auxiliary electrode.

12. An organic light-emitting display device, comprising:
first electrodes;
an organic light-emitting layer on each of the first electrodes;
a second electrode on the organic light-emitting layer;
a plurality of color filters each in correspondence with the first electrodes, respectively; and
a low refractive index medium layer between adjacent color filters, the low refractive index medium layer having a refractive index lower than respective refractive indexes of each of the plurality of color filters,
wherein the organic light-emitting layer comprises:
two or more stacks, each stack comprising:
a hole transporting layer,
at least one light-emitting layer, and
an electron transporting layer, and
a charge generating layer vertically between the two or more stacks, and
wherein a height of the charge generating layer is lower than a height of the first pixel-defining layer.

13. The organic light-emitting display device of claim 12, further comprising:
a pixel-defining layer configured to divide the first electrodes,
wherein the low refractive index medium layer overlaps the pixel-defining layer.

14. The organic light-emitting display device of claim 13, wherein the pixel-defining layer comprises:
a first pixel-defining layer configured to divide the first electrodes; and
a second pixel-defining layer on the first pixel-defining layer,
wherein a width of the second pixel-defining layer is wider than a width of the first pixel-defining layer.

15. A method of manufacturing an organic light-emitting display device, the method comprising:
providing a thin film transistor (TFT);
providing a planarization layer on the TFT;
providing a pixel-defining layer, comprising providing, on the planarization layer, a first pixel-defining layer and a second pixel-defining layer, a width of the second pixel-defining layer being wider than a width of the first pixel-defining layer;
providing a first electrode on the planarization layer;
providing an organic light-emitting layer on the first electrode; and
providing a second electrode on the organic light-emitting layer,
wherein the providing the organic light-emitting layer comprises:
providing two or more stacks, the providing each stack comprising:
providing a hole transporting layer,
providing at least one light-emitting layer, and
providing an electron transporting layer, and
providing a charge generating layer vertically between the two or more stacks, and
wherein a height of the charge generating layer is lower than a height of the first pixel-defining layer.

\* \* \* \* \*